United States Patent
Koh et al.

(10) Patent No.: US 10,353,029 B2
(45) Date of Patent: Jul. 16, 2019

(54) MAGNETIC RESONANCE IMAGING DEVICE AND METHOD FOR CONTROLLING THE SAME

(71) Applicant: Samsung Electronics Co., Ltd., Suwon-si (KR)

(72) Inventors: Dong Yean Koh, Suwon-si (KR); Han Lim Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 363 days.

(21) Appl. No.: 15/186,741

(22) Filed: Jun. 20, 2016

(65) Prior Publication Data
US 2017/0059674 A1    Mar. 2, 2017

(30) Foreign Application Priority Data
Aug. 31, 2015    (KR) .................. 10-2015-0123080

(51) Int. Cl.
*G01R 33/36* (2006.01)
*G01R 33/54* (2006.01)
*H03K 17/00* (2006.01)

(52) U.S. Cl.
CPC ..... *G01R 33/3642* (2013.01); *G01R 33/3664* (2013.01); *G01R 33/543* (2013.01); *H03K 17/002* (2013.01)

(58) Field of Classification Search
CPC ............ G01R 33/3415; G01R 33/3621; G01R 33/36; G01R 33/3642; G01R 33/3664; G01R 33/543; H03K 17/002

(Continued)

(56) References Cited

U.S. PATENT DOCUMENTS 4,585,995 A * 4/1986 Flugan ................ G01R 33/421
324/318
4,769,605 A * 9/1988 Fox .................... G01R 33/3628
324/322

(Continued)

FOREIGN PATENT DOCUMENTS

CN    101261315    9/2008
CN    203444094    2/2014

(Continued)

OTHER PUBLICATIONS

Korean Office Action dated Sep. 1, 2016 in Korean Patent Application No. 10-2015-0123080.

(Continued)

*Primary Examiner* — Patrick Assouad
*Assistant Examiner* — Demetrius R Pretlow
(74) *Attorney, Agent, or Firm* — Staas & Halsey LLP

(57) ABSTRACT

A magnetic resonance imaging (MRI) device includes at least one switching cell that uses a first switcher to switch paths for two of four radio frequency (RF) signals is used to output the two RF signals. The MRI device includes RF coils including a plurality of coils for receiving RF signals from an object to which magnetic fields are applied; an image processor for creating a magnetic resonance image based on the received RF signals; and a switching unit for switching connections between a plurality of input ports connectable to the plurality of coils and a plurality of output ports connectable to the image processor, wherein the switching unit includes at least one switching cell including four input ports, two output ports connected to two of the four input ports, and a first switcher for switching between paths extended from second and third input ports among the four input ports.

16 Claims, 25 Drawing Sheets

(58) Field of Classification Search
USPC .......................................................... 324/309
See application file for complete search history.

(56) References Cited

U.S. PATENT DOCUMENTS

| | | | | |
|---|---|---|---|---|
| 4,841,268 | A * | 6/1989 | Burnett | H01F 6/065 |
| | | | | 174/15.4 |
| 4,950,994 | A * | 8/1990 | Glover | G01R 33/385 |
| | | | | 324/318 |
| 4,975,644 | A * | 12/1990 | Fox | G01R 33/3415 |
| | | | | 324/318 |
| 5,932,936 | A | 8/1999 | Potthast et al. | |
| 8,035,389 | B2 * | 10/2011 | Xing | G01R 33/3664 |
| | | | | 324/322 |
| 2003/0057944 | A1 * | 3/2003 | Van Helvoort | G01R 33/3415 |
| | | | | 324/300 |
| 2003/0132750 | A1 * | 7/2003 | Machida | G01R 33/3415 |
| | | | | 324/322 |
| 2007/0164742 | A1 * | 7/2007 | Bito | G01R 33/34046 |
| | | | | 324/318 |
| 2008/0218168 | A1 | 9/2008 | Takagi | |
| 2009/0174498 | A1 | 7/2009 | Xing et al. | |
| 2010/0148778 | A1 * | 6/2010 | Biber | G01R 33/3415 |
| | | | | 324/318 |
| 2010/0225317 | A1 * | 9/2010 | Biber | G01R 33/3415 |
| | | | | 324/309 |
| 2012/0306498 | A1 | 12/2012 | Takagi | |
| 2013/0234714 | A1 * | 9/2013 | Li | G01R 33/3664 |
| | | | | 324/322 |
| 2014/0159719 | A1 | 6/2014 | Chon | |
| 2015/0160318 | A1 * | 6/2015 | Campagna | G01R 33/3621 |
| | | | | 324/309 |
| 2015/0253399 | A1 * | 9/2015 | Okamoto | G01R 33/3664 |
| | | | | 324/322 |
| 2015/0276899 | A1 * | 10/2015 | Dai | G01R 33/3621 |
| | | | | 324/318 |
| 2017/0181709 | A1 * | 6/2017 | Wang | G01R 33/5673 |

FOREIGN PATENT DOCUMENTS

| | | |
|---|---|---|
| CN | 104905789 | 9/2015 |
| JP | 4000103 | 8/2007 |
| JP | 2009-278459 | 11/2009 |
| JP | 2012-115455 | 6/2012 |
| KR | 10-2014-0073202 | 6/2014 |

OTHER PUBLICATIONS

Extended European Search Report dated Jan. 31, 2017 in European Patent Application No. 16183941.0.

Korean Notice of Allowance dated Feb. 8, 2017 in Korean Patent Application No. 10-2015-0123080.

Korean Office Action dated Dec. 1, 2016 in Korean Patent Application No. 10-2015-0123080.

A. Potthast et al., "A MRI system with 128 seamlessly integrated receive channels", Proc. Inti. Soc. Mag. Reson. Med. 15, 2007, pp. 246.

Chinese Office Action dated Jan. 4, 2019 in Chinese Patent Application No. 201610791174.3.

* cited by examiner

MAGNETIC RESONANCE IMAGING DEVICE AND METHOD FOR CONTROLLING THE SAME

CROSS-REFERENCE TO RELATED APPLICATIONS

This application claims priority to and the benefit of Korean Patent Application No. 10-2015-0123080, filed on Aug. 31, 2015, the disclosure of which is incorporated herein by reference in its entirety.

BACKGROUND

1. Field

The following description relates to a magnetic resonance imaging (MRI) device and method for controlling the same to create a magnetic resonance image of an object.

2. Description of the Related Art

In general, a medical imaging apparatus acquires information about a patient and provides corresponding images. The medical imaging apparatus includes an X-ray device, an ultrasonic diagnostic device, a Computerized Tomography (CT) scanner, a Magnetic Resonance Imaging (MRI) device, and the like.

Among them, the MRI device is relatively free from image scanning conditions and provides excellent soft-tissue contrast and various diagnostic information images, thereby holding a key position in areas of diagnostics.

MRI is a medical technique to use magnetic fields that are harmless to human bodies and radio frequencies (RF) that are non-ionizing radiation, to cause nuclear magnetic resonance to the nuclei of hydrogen atoms in the body, thereby imaging the density and physicochemical properties of the atomic nuclei.

Specifically, the MRI device images an internal part of an object by supplying energy at a certain frequency while applying a magnetic field within the gantry and converting energy emitted from the atomic nuclei to a signal.

In this regard, RF coils are used to receive the energy emitted from the atomic nuclei, and the RF coils may be arranged separately from the patient table. Generally, the RF coils may be kept separately from the patient table at ordinary times, and connected to the patient table to be used in MRI scanning.

SUMMARY

Additional aspects and/or advantages will be set forth in part in the description which follows and, in part, will be apparent from the description, or may be learned by practice of the invention.

Embodiments of the present disclosure are directed to a magnetic resonance imaging (MRI) device and method for controlling the same, whereby at least one switching cell that uses a first switcher to switch paths for two of four radio frequency (RF) signals is used to output the two RF signals.

According to an aspect of the present disclosure, a magnetic resonance imaging (MRI) device includes radio frequency (RF) coils including a plurality of coils for receiving RF signals from an object to which magnetic fields are applied; an image processor for creating a magnetic resonance image based on the received RF signals; and a switching unit for switching connections between a plurality of input ports connectable to the plurality of coils and a plurality of output ports connectable to the image processor, wherein the switching unit includes at least one switching cell including four input ports, two output ports connected to two of the four input ports, and a first switcher for switching between paths extended from second and third input ports among the four input ports.

The switching cell may further include a second switcher for selectively connecting one path produced by the first switcher or a first input port of the four input ports to a first output port of the two output ports; and a third switcher for selectively connecting the other path produced by the first switcher or a fourth input port of the four input ports to a second output port of the two output ports.

The first switcher may include a first sub input port connected to the second input port, and a second sub input port connected to the third input port; a first sub output port, and a second sub output port; and a first switch for connecting the first sub input port to one of the first and second sub output ports and connecting the second sub input port to the other one of the first and second sub output ports.

The switching cell may further include a second switcher for selectively connecting a first input port of the four input ports or the first sub output port of the first switcher to the first output port of the two output ports; and a third switcher for selectively connecting a fourth input port of the four input ports or the second sub output port of the first switcher to the second output port of the two output ports.

The second switcher may include a third sub input port connected to the first input port, and a fourth sub input port connected to the first sub output port; and the third switcher may include a fifth sub input port connected to the second sub input port, and a sixth sub input port connected to the fourth input port.

The second switcher may include a third sub output port connected to the first output port of the two output ports; and a second switch for connecting one of the third and fourth sub input ports to the third sub output port, and the third switcher may include a fourth sub output port connected to the second output port of the two output ports; and a third switch for connecting one of the fifth and sixth sub input ports to the fourth sub output port.

The second switcher may include a fifth sub output port connected to the first output port of the two output ports, and a sixth sub output port connected to a first resistor; and a fourth switch for connecting the third sub input port to one of the fifth and sixth sub output ports and connecting the fourth sub input port to the other one of the fifth and sixth sub output ports, and the third switcher may include a seventh sub output port connected to the first output port of the two output ports, and an eighth sub output port connected to a second resistor; and a fifth switch for connecting the fifth sub input port to one of the seventh and eighth sub output ports and connecting the sixth sub input port to the other one of the seventh and eighth sub output ports.

The switching unit may include at least one upper switching cell including two switching cells and an upper switcher for switching between paths extended from four output ports of the two switching cells.

The upper switcher may include four upper input ports connected to four output ports of the two switching cells and four upper output ports connected to the four upper input ports, and switch connections between the four upper input ports and the four output ports.

The upper switcher may include a fourth switcher for switching between paths extended from the two output ports of a first switching cell of the two switching cells; a fifth switcher for switching between paths extended from the two output ports of a second switching cell of the two switching cells; a sixth switcher for switching between one path produced by the fourth switcher and one path produced by the fifth switcher; a seventh switcher for switching between the other one path produced by the fourth switcher and one path produced by the sixth switcher; and an eighth switcher for switching between the other one path produced by the fifth switcher and the other one path produced by the sixth switcher.

According to an aspect of the present disclosure, a method for controlling a magnetic resonance imaging (MRI) device including at least one switching cell for switching between four input ports connectable to radio frequency (RF) coils receiving RF signals of an object and two output ports connected to two of the four input ports includes determining two input ports corresponding to the object from among the four input ports; changing status of a first switcher for switching between paths extended from second and third input ports of the four input ports, such that the determined input ports are connected to the output ports; changing status of a second switcher to connect one path produced by the first switcher or a first input port of the four input ports to a first output port of the two output ports, according to the status of the first switcher; and changing status of a third switcher to connect the other one path produced by the first switcher or a fourth input port of the four input ports to a second output port of the two output ports, according to the status of the first switcher.

Determining two input ports may include determining two input ports that are coupled with some of the RF coils, which receive RF signals originated from the object.

Changing status of a first switcher may include changing the first switcher into one of a first state of connecting a first sub input port of the first switcher connected to the second input port to a first sub output port of the first switcher and connecting a second sub input port of the first switcher connected to the third input port to a second sub output port of the first switcher, and a second state of connecting the first sub input port to the second sub output port and connecting the second sub input port to the first sub output port.

Changing status of a second switcher may include changing the second switcher into one of a third state of connecting a third sub input port of the second switcher connected to the first input port of the four input ports to the first output port, and a fourth state of connecting a fourth sub input port of the second switcher connected to the first sub output port of the first switcher to the first output port.

Changing status of a third switcher may include changing the third switcher into one of a fifth state of connecting a fifth sub input port of the third switcher connected to the fourth input port of the four input ports to the second output port, and a sixth state of connecting a sixth sub input port of the third switcher connected to the second sub output port of the first switcher to the second output port.

BRIEF DESCRIPTION OF THE DRAWINGS

The above and other objects, features, and advantages of the present disclosure will become more apparent to those of ordinary skill in the art by describing in detail exemplary embodiments thereof with reference to the accompanying drawings, in which.

DETAILED DESCRIPTION

Figure 1:
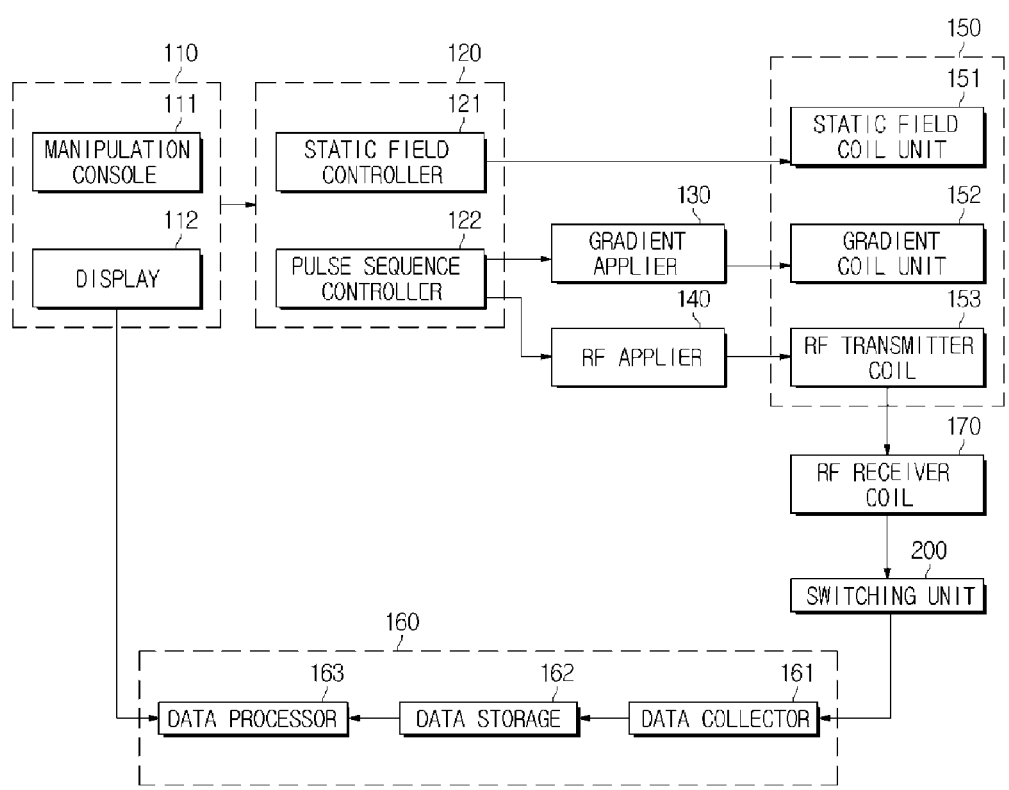
FIG. 1 is a control block diagram of a magnetic resonance imaging (MRI) device, according to an embodiment of the present disclosure.

Embodiments of the present disclosure will now be described with reference to accompanying drawings. Throughout the drawings, like reference numerals may refer to like parts or components.

FIG. 1 is a control block diagram of a magnetic resonance imaging (MRI) device, according to an embodiment of the present disclosure. General operation of an MRI device will now be described with reference to FIG. 1. Especially, it is assumed herein that a radio frequency (RF) receiver coils are separated from a magnet assembly.

Referring to FIG. 1, an MRI device in accordance with an embodiment of the present disclosure may include a magnet assembly 150 for producing magnetic fields and causing resonance to atomic nuclei, a controller 120 for controlling operation of the magnet assembly 150, and an image processor 160 for creating a magnetic resonance image based on echo signals, i.e., magnetic resonance signals originated from the atomic nuclei. The MRI device may further include an RF receiver coil 170 for receiving the magnetic resonance signal originated from the magnet assembly and forwarding it to the image processor 160, and a switching unit 200 for setting up a path for the magnetic resonance signal received from the RF receiver coil 170 to proceed to the image processor 160.

The magnet assembly 150 may include a static field coil unit 151 for producing a static field in its internal space, a gradient coil unit 152 for producing a gradient field by producing a gradient in the static field, and an RF transmitter coil 153 for applying RF pulses. For example, if an object is located in the internal space of the magnet assembly 150, a static field, a gradient field, and an RF pulse may be applied to the object. The RF pulse applied excites nuclei of atoms that make up the object, and accordingly, an echo signal is generated.

The RF receiver coil 170 may receive RF signals, i.e., magnetic resonance signals emitted from the excited atomic nuclei. The RF receiver coil 170 is often attached onto the human body, so it is common for the RF receiver coil 170 to be customized to the shape of each part of the human body and thus include a head coil, a neck coil, a back coil, etc.

As an example of the RF receiver coil 170 that is separable from the magnet assembly 150, there is a surface coil for receiving excited magnetic resonance signals from a part of the object. Compared to a volume coil, the surface coil is relatively small in size and has the form of a two dimensional (2D) plane, so the surface coil has significantly high signal to noise ratio (SNR).

As an example of the RF receiver coil 170, there may be an array coil that widens the receiving range by arraying a number of surface coils in one dimension (1D) or 2D. The array coil may have different array forms depending on the part to be scanned, and may be classified into one for head, one for head and neck, one for breasts, one for spine, one for abdomen, one for legs, etc. Because relative positions of the surface coils that make up the array coil are different, phases of signals received by the surface coils are also different. Accordingly, an image with a high SNR may be acquired by taking into account receive phases of the surface coils in reconstructing the image by combining the signals received by the surface coils.

The controller 120 may include a static field controller 121 for controlling strength and direction of a static field produced by the static field coil unit 151, and a pulse sequence controller 122 for designing a pulse sequence and controlling the gradient coil unit 152 and the RF transmitter coil 153 according to the pulse sequence.

The MRI device 100 may include a gradient applier 130 for applying a gradient signal to the gradient coil unit 152 and an RF applier 140 for applying an RF signal to the RF transmitter coil 153. The pulse sequence controller 122 may control the gradient applier 130 and RF applier 140 to regulate a gradient magnetic field produced in the internal space of the magnet assembly 150 and an RF to be applied to atomic nuclei.

The image processor 160 may include a data collector 161 for receiving data about a spin echo signal, i.e., a magnetic resonance signal produced from the atomic nuclei, a data storage 162 for storing data received from the data collector 161, and a data processor 163 for processing the stored data to create a magnetic resonance image.

The data collector 161 may include a preamplifier for amplifying a magnetic resonance signal received by the RF receiver coil 170, a phase detector for detecting a phase from the magnetic resonance signal sent from the preamplifier 161, an analog-to-digital (A/D) converter for converting an analog signal obtained by phase detection to a digital signal. The data collector 161 may also send the digitally converted magnetic resonance signal to the data storage 162.

A data space, which corresponds to a 2D Fourier space, is formed in the data storage 162, and once the entire scanned data has been stored, the data processor 163 may reconstruct an image of the object (ob) by performing 2D inverse Fourier transformation on the data in the 2D Fourier space. The reconstructed image may be displayed on a display 112.

Furthermore, the MRI device 100 may include a user manipulation unit 110 to receive control commands for general operation of the MRI device 100, and especially, receive a command about a scan sequence from the user to generate a pulse sequence accordingly.

The user manipulation unit 110 may include a manipulation console 111 equipped for the user to manipulate the system, and the display 112 for displaying an image created by the image processor 160 so that the user may diagnose health conditions of the object.

Figure 2:
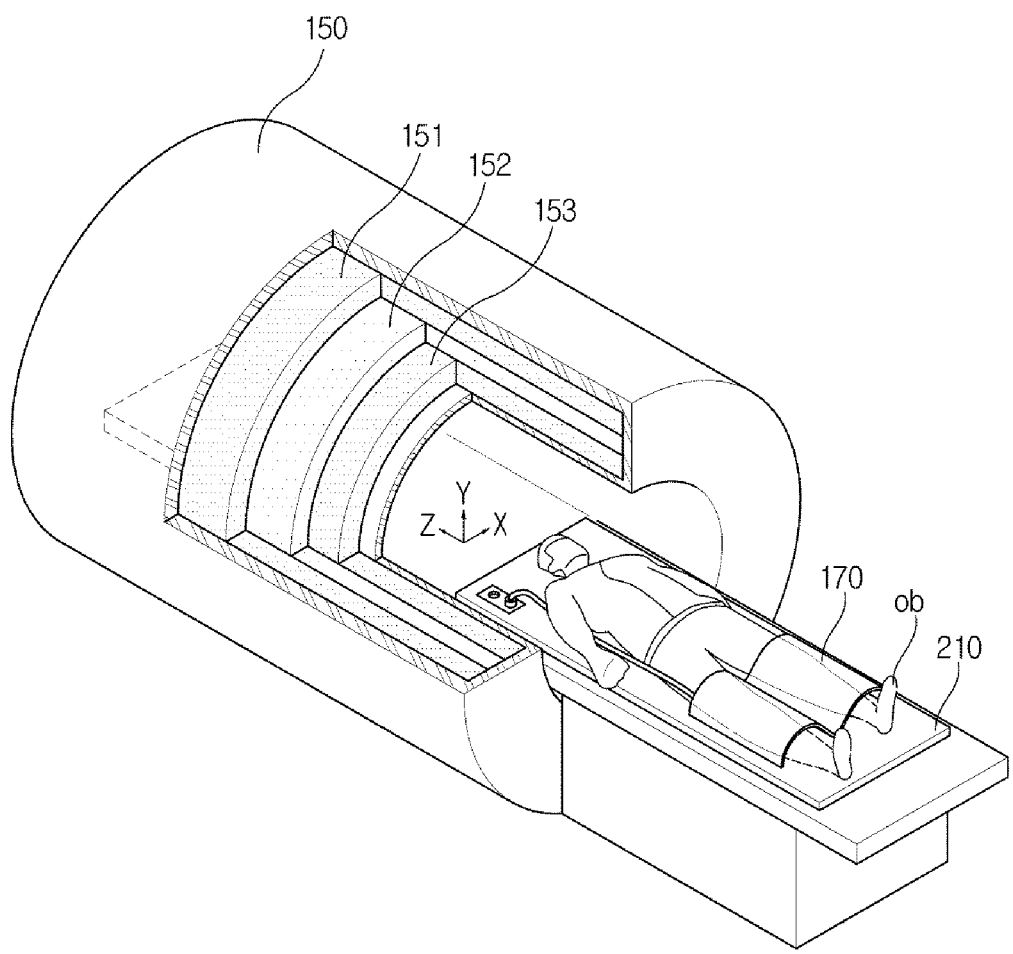
FIG. 2 schematically shows the exterior of an MRI device.
Figure 3:
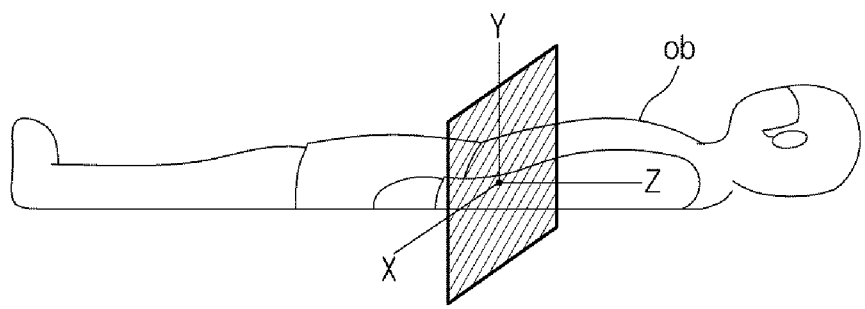
FIG. 3 shows a space where an object is lying down, which is divided into x, y, and z axes.
Figure 4:
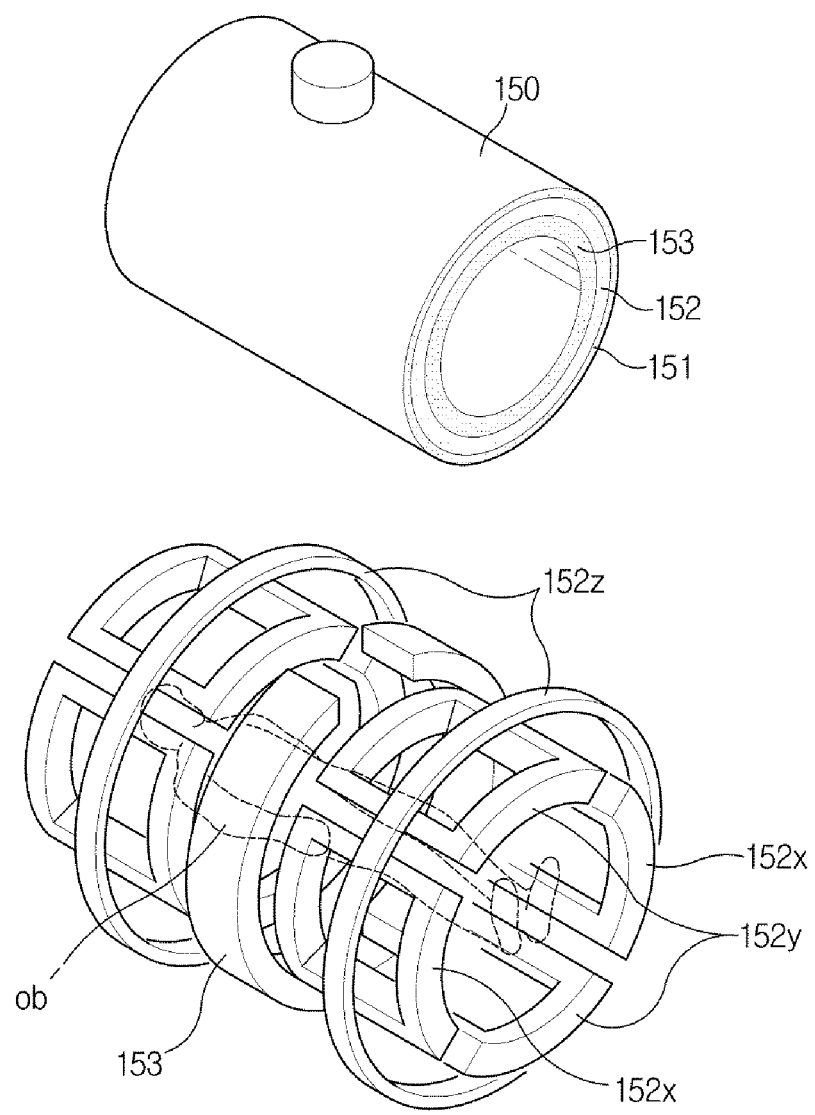
FIG. 4 shows a structure of a magnet assembly and a structure of a gradient coil unit.

FIG. 2 schematically shows the exterior of an MRI device, FIG. 3 shows a space where an object is lying down, which is divided into x, y, and z axes, and FIG. 4 shows a structure of a magnet assembly and a structure of a gradient coil unit.

Operation of the MRI device 100 in accordance with an embodiment of the present disclosure will now be described in detail in conjunction with FIG. 1.

Referring to FIG. 2, the magnet assembly 150 has a cylindrical form with its internal space empty, and is also called a gantry or bore. The internal space is called a cavity. A patient table 210 transports an object (ob) lying down thereon to acquire magnetic resonance signals.

The magnet assembly 150 includes a static field coil unit 151, a gradient coil unit 152, and an RF transmitter coil 153.

The static field coil unit 151 may be in the form of coils wound around the cavity, and produce a static field in the internal space, i.e., the cavity of the magnet assembly 150 if a current is applied to the static field coil unit 151.

The direction of the static field is, in general, parallel to the driving axle of the magnet assembly 150.

Once the static field is produced in the cavity, nuclei of atoms that make up the object (ob), especially hydrogen atoms, are aligned in the direction of the static field, and precess about the direction of the static field. The nuclei's speed of precession may be represented by a precession frequency, called a Larmor frequency, which may be expressed in the following equation 1:

$$\omega = \gamma B0 \qquad (1)$$

$\omega$ represents the Larmor frequency, $\gamma$ represents a proportional factor, and B0 represents a strength of an external magnetic field. The proportional factor may vary by type of nucleus, a Tesla (T) or Gauss (G) is a unit of the strength of the external magnetic field, and a hertz (Hz) is a unit of the precession frequency.

For example, a proton of hydrogen has a precession frequency of 42.58 MHz in 1T of external magnetic field, and because hydrogen accounts for the biggest percentage among atoms that make up the human body, the precession of protons of hydrogen is mainly used to acquire a magnetic resonance signal in the MRI device.

The gradient coil unit 152 produces a gradient field or gradient magnetic field by producing a gradient in the static field formed in the cavity.

As shown in FIG. 3, it may be determined that an axis parallel to the longitudinal direction from head to toe of the object (ob), i.e., an axis parallel to the direction of the static field is the z axis, an axis parallel to the left-right direction of the object (ob) is the x axis, and an axis parallel to the vertical direction of the internal space is the y axis.

To obtain three dimensional (3D) spatial information regarding the magnetic resonance signal, gradient fields for all the x, y, and z axes are required. For this, the gradient coil unit 152 includes three pairs of gradient coils.

As shown in FIG. 4, gradient coils for z axis 152z may generally include a pair of ring type coils, and gradient coils for y axis 152y may be located above and below the object. Gradient coils for x axis 152x may be located to the left and right sides of the object (ob).

Figure 5:
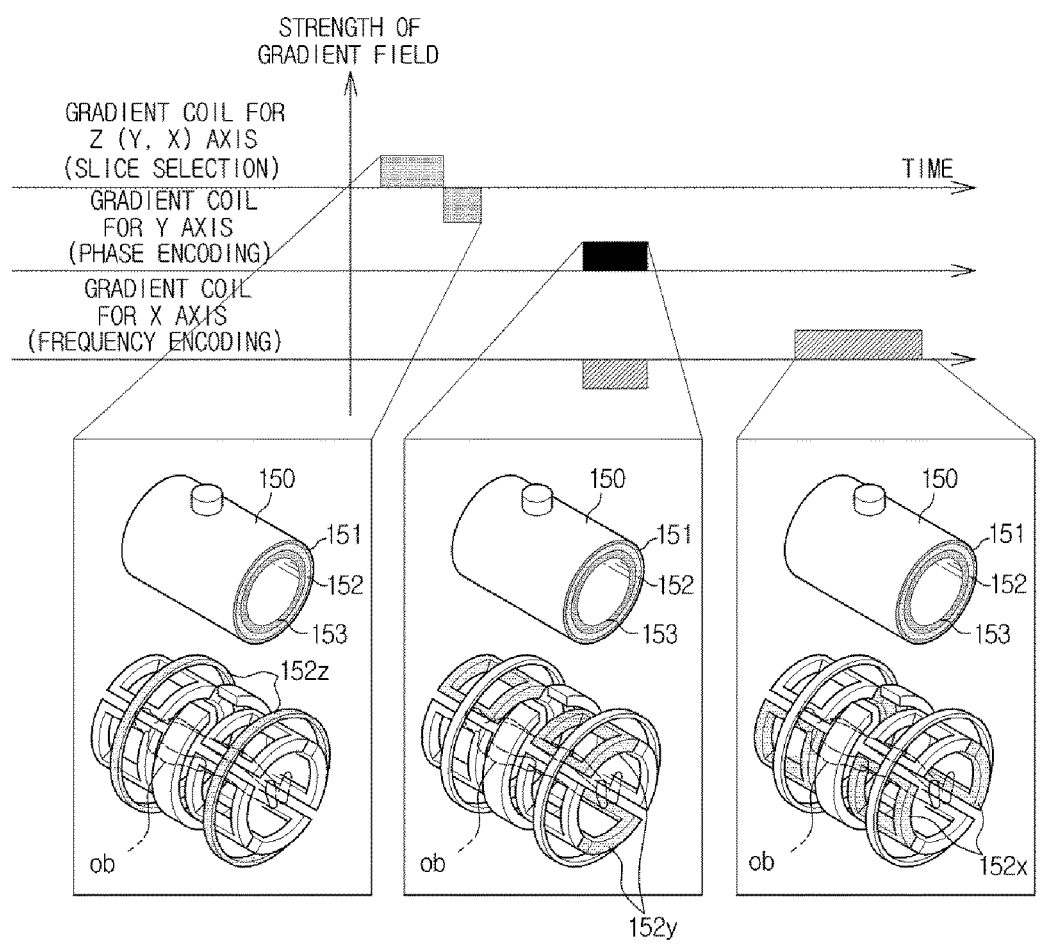
FIG. 5 shows pulse sequences related to operation of respective gradient coils that make up a gradient coil unit.

FIG. 5 shows pulse sequences related to operation of respective gradient coils that make up a gradient coil unit.

When direct currents with opposite polarities flow through two gradient coils for z axis 152z in the opposite directions, a change in magnetic field occurs in the direction of the z axis, thus producing a gradient field.

Once the gradient field is produced by the currents flowing through the gradient coils for z axis 152z for a predetermined time, the resonance frequency is changed to be higher or lower according to the strength of the gradient field. If the RF transmitter coil 153 applies a high frequency signal for a particular location, only protons in a cross-section corresponding to the particular location are resonated. Accordingly, the gradient coils for z axis 152z are used for slice selection. As the gradient of the gradient field produced in the direction of the z axis increases, a thinner slice may be selected.

If a slice is selected based on the gradient field produced by the gradient coils for z axis, all spins that make up the slice have the same frequency and the same phase, which makes it impossible to tell a spin from another.

At this time, if a gradient field is produced by the gradient coils for y axis 152y in the direction of the y axis, the gradient field may cause phase shift to make rows of a slice have different phases.

Specifically, once the gradient field is produced in the y axis, spins of a row to which a strong magnetic field is applied undergo a phase change into a high frequency, while spins of row to which a weak magnetic field is applied undergo a phase change into a lower frequency. If the gradient field in the y axis disappears, respective rows of a selected slice are phase-shifted to different phases, which enables the rows to be distinguished. The gradient field produced by the gradient coils for y axis 152y may be used in phase encoding.

A slice is selected according to a gradient field produced by the gradient coils for z axis 152z, and rows constituting the selected slice may be distinguished by different phases according to a gradient field produced by the gradient coils for y axis 152y. However, the spins constituting a row may not be distinguished because they all have the same frequency and the same phase.

In this regard, if a gradient field is produced in the direction of the x axis by the gradient coils for x axis 152x, the gradient field in the x axis may cause the spins constituting each row to have different frequencies, thus enabling the respective spins to be distinguished. As such, the gradient field produced by the gradient coils for x axis 152x may be used in frequency encoding.

As discussed above, the gradient fields produced by the gradient coils for z, y, and x axes may enable spatial encoding of spatial positions of respective spins through slice selection, phase encoding, and frequency encoding.

The gradient coil unit 152 may be coupled with the gradient applier 130, which applies current pulses to the gradient coil unit 152 according to a control signal sent from the sequence controller 122 to produce a gradient field. Accordingly, the gradient applier 130 may also be called a gradient power source, including three driving circuits corresponding to the three pairs of gradient coils 152z, 152y, and 152x that constitute the gradient coil unit 152.

As discussed above, the atomic nuclei aligned by an external magnetic field precess at the Larmor frequency, and the vector sum of magnetization of the multiple atomic nuclei may be represented by net magnetization M.

It is not possible to measure a z axis component of the average magnetization but only detect $M_{XY}$. Accordingly, to obtain a magnetic resonance signal, there is a need to make the average magnetization exist on the xy plane through excitation of the atomic nuclei. For excitation of the atomic nuclei, an RF pulse tuned to the Larmor frequency of the atomic nuclei is to be applied to a static field.

The RF transmitter coil 153 is coupled with the RF applier 140, which applies a high frequency signal to the RF transmitter coil 153 according to a control signal received from the pulse sequence controller 122 such that the RF transmitter coil 153 may transmit RF pulses to the inside of the magnet assembly 150.

The RF applier 140 may include a modulation circuit for modulating a high frequency signal to a pulse signal, and an RF power amplifier for amplifying the pulse signal.

Furthermore, the RF receiver coil 170 may receive an RF signal, i.e., a magnetic resonance signal emitted from the excited atomic nucleus. The RF receiver coil 170 sends the magnetic resonance signal to the image processor 160 through the switching unit 200, and the image processor 160 may process the magnetic resonance signal to create a magnetic resonance image. Specifically, the image processor 160 may include the data collector 161 for collecting and processing magnetic resonance signals from the RF receiver coil 170, and a data processor for creating a magnetic resonance image based on the data received from the data collector 161.

The data collector 161 may include a preamplifier for amplifying a magnetic resonance signal received by the RF coil 170, a phase detector for detecting a phase from the magnetic resonance signal sent from the preamplifier, and an analog-to-digital (A/D) converter for converting an analog signal obtained by phase detection to a digital signal. The data collector 161 may also send the digitally converted magnetic resonance signal to the data storage 162.

Alternatively, an amplifying device for amplifying a magnetic resonance signal received by the RF receiver coil 170 is included, but the data collector 161 may not include the pre-amplifier.

A data space, which corresponds to a 2D Fourier space, is formed in the data storage 162, and once the entire scanned data has been stored, the data processor 163 may reconstruct an image of the object (ob) by performing 2D inverse Fourier transformation on the data in the 2D Fourier space. The reconstructed image may be displayed on the display 112.

As a method for acquiring a magnetic resonance signal from an atomic nucleus, a spin echo pulse sequence is mainly used. In a case that the RF transmitter coil 153 applies RF pulses, if an RF pulse is first applied and another RF pulse is applied with a time interval Δt, strong transverse magnetization occurs to the atomic nuclei after the passage of another Δt, and a magnetic resonance signal may then be obtained. This is referred to as an echo pulse sequence, and time taken from when the first RF is applied until the magnetic resonance signal is produced is called Time Echo (TE).

How much a photon is flipped may be represented by an angle the photon moves from an axis on which the photon was located before being flipped, and represented as a 90-degree RF pulse, a 180-degree RF pulse, etc., depending on the extent of being flipped.

Meanwhile, the RF receiver coil may vary in type, depending on the object (e.g., particular parts of a human body) to be imaged. For example, the RF receiver coil may include a head coil, a spine coil, a shoulder coil, a breast coil, a torso coil, a knee coil, a PV coil, a foot-ankle coil, or the like.

The switching unit 200 may receive a magnetic resonance signal, i.e., an RF signal received by the RF receiver coil through a plurality of input ports 340 that may be coupled with the various kinds of RF receiver coils. Specifically, the plurality of input ports 340 of the switching unit 200 may be allocated to a plurality of coils that make up the various kinds of RF receiver coils. As a result, the plurality of input ports 340 of the switching unit 200 may receive RF signals from the plurality of coils that make up the various kinds of RF receiver coils.

The switching unit 200 may include a plurality of output ports 350 to output some or all of the received RF signals, and the plurality of output ports 350 may be connected to the image processor for outputting the RF signals to the image processor.

The switching unit 200 may switch connections between the plurality of input ports 340 and the plurality of output ports 350 such that only RF signals received from the object (ob) for which a magnetic resonance image is to be created are output among RF signals input to the respective input ports 340. Especially, if there is a difference in number between the input ports 340 and the output ports 350, the switching unit 200 may switch connections between the input ports 340 and output ports 350 to selectively output the received RF signals to the image processor.

For this, the switching unit 200 may typically include a plurality of switches for connecting the respective input ports 340 to the respective output ports 350. In this case, the switching unit 200 with M input ports 340 and N output ports 350 needs to have M×N switches. If the number of the input ports 340 and output ports 350 increases, the number of switches required increases exponentially, causing the circuit for the switching unit 200 to be larger. It may also lead to an increase in manufacturing cost. In addition, complexity of the circuit configuration may increase because a lot of switches need to be individually controlled, and signal interference problems caused by the complexity might occur.

Accordingly, an MRI device is required to include the switching unit 200 that has simple circuit configuration with less switches while having the same capability of signal output.

The switching unit 200 that overcomes the aforementioned problems will now be described in detail.

Figure 6A:
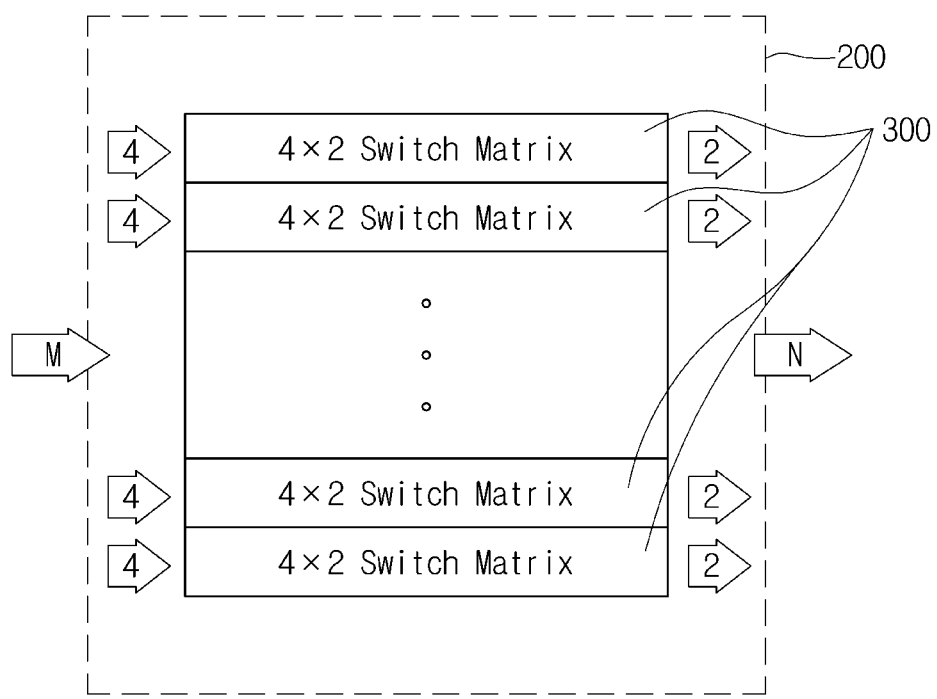
FIGS. 6A, 6B, and 6C are diagrams for explaining operation of a switching unit and the constituent switching cells, according to an embodiment of the present disclosure.
Figure 6B:
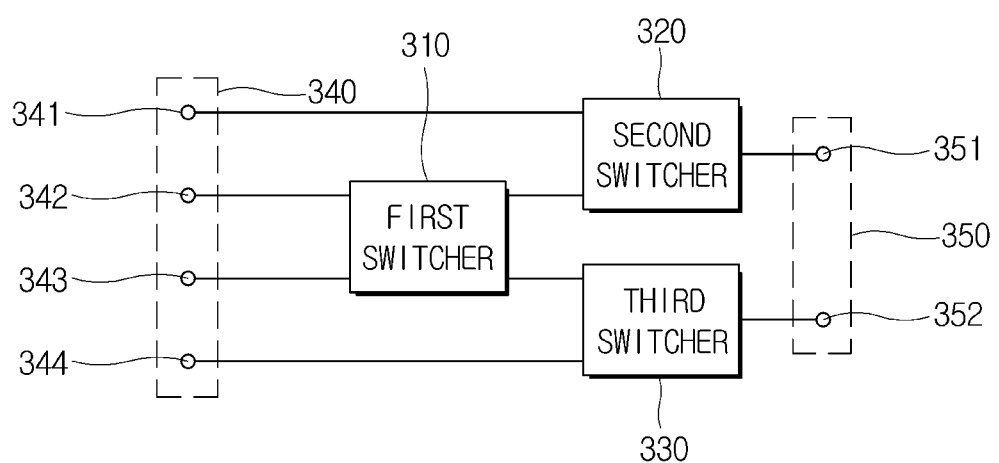
Figure 6C:
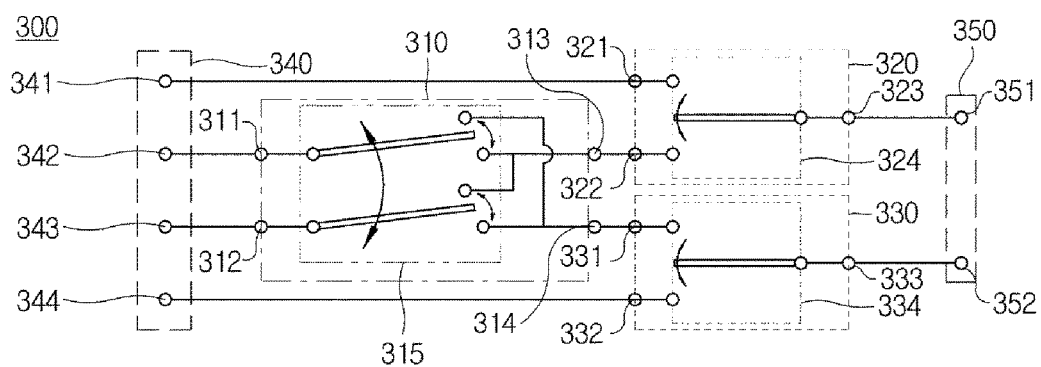

FIGS. 6A, 6B, and 6C are diagrams for explaining operation of a switching unit and the constituent switching cells, according to an embodiment of the present disclosure.

FIG. 6A is a diagram for explaining a way for the switching unit 200 to output signals, according to an embodiment of the present disclosure. The switching unit 200 of FIG. 6A includes M input ports 340 that may be coupled to a plurality of coils that make up the RF receiver coil 170 and N output ports 350 connected to the image processor.

Referring to FIG. 6A, the M×N switching unit 200 may be divided into 4×2 switching cells 300. Specifically, the switching unit 200 having the M input ports and N output ports may include a plurality of switching cells 300 each with four input ports 340 and two output ports 350. The plurality of switching cells 300 are separately configured, and connections between the four input ports 340 and two output ports 350 included in each switching cell 300 may be controlled.

FIG. 6B is a block diagram of a switching cell 300 according to an embodiment of the present disclosure, and FIG. 6C is a circuit diagram of the switching cell 300 according to an embodiment of the present disclosure.

A single switching cell 300 in accordance with an embodiment of the present disclosure may include four input ports 340, two output ports 350, and first to third switchers 310, 320, and 330 for controlling connections between the input ports 340 and output ports 350.

The four input ports 340 may be coupled to the RF receiver coil 170. Four input ports 340 of the switching cell 300 may be coupled with the coils included in the same RF receiver coil 170, or may be coupled with coils belonging to different kinds of RF receiver coils.

In the following description, for convenience of explanation, the four input ports 340 are assumed to have a first input port 341, a second input port 342, a third input port 343, and a fourth input port 344.

The two output ports 350 may be connected to the image processor 160. RF signals output through the two output ports 350 may be transformed into a magnetic resonance image by the image processor 160.

In the following description, for convenience of explanation, two output ports 350 are assumed to have a first output port 351 and a second output port 352.

The switching cell 300 may connect two input ports 340 and two output ports 350 through the first to third switchers 310, 320, and 330. Especially, the switching cell 300 may connect some (e.g., two in this embodiment) of the four input ports 340 coupled with the RF receiver coils 170, which have received RF signals from the object (ob) to be imaged, to the output ports 350. As a result, the RF signals from the object (ob) may be sent to the image processor 160 through the two output ports 350.

For this, the first switcher 310 may be implemented to be able to switch between paths extended from the second and third input ports 342 and 343. Specifically, the first switcher 310 may include a first sub input port 311 connected to the second input port 342 and a second sub input port 312 connected to the third input port 343; a first sub output port 313 and a second sub output port 314; and a first switch 315 for connecting the first sub input port 311 to one of the first and second sub output ports 313 and 314 and connecting the second sub input port 312 to the other one of the first and second sub output ports 313 and 314.

Referring to FIG. 6C, the first switch 315 may connect the second sub input port 312 to the second sub output port 314 while connecting the first sub input port 311 to the first sub output port 313. Alternatively, the first switch 315 may connect the second sub input port 312 to the first sub output port 313 while connecting the first sub input port 311 to the second sub output port 314.

As a result, if the first switch 315 forms a path from the first sub input port 311 to the first sub output port 313 and a path from the second sub input port 312 to the second sub output port 314, an RF signal received through the second input port 342 may be output through the first sub output port 313, and an RF signal received through the third input port 343 may be output through the second sub output port 314. Furthermore, if the first switch 315 forms a path from the first sub input port 311 to the second sub output port 314 and a path from the second sub input port 312 to the first sub output port 313, an RF signal received through the second input port 342 may be output through the second sub output port 314, and an RF signal received through the third input port 343 may be output through the first sub output port 313.

As such, the first switcher 310 may switch between paths extending from the second and third input ports 342 and 343 by controlling connections between the first and second sub input ports 311 and 312, and the first and second sub output ports 313 and 314.

In an embodiment of the present disclosure, the first switcher 310 may be implemented in the form of Double Pole Double Throw (DPDT), but is not limited thereto.

The second switcher 320 may selectively connect one of the paths formed by the first switcher 310 or the first input port 341 to the first output port 351. In addition, the third switcher 330 may selectively connect the other one of the paths formed by the first switcher 320 or the fourth input port 344 to the second output port 352.

For this, the second switcher 320 may selectively connect the first input port 341 or the first sub output port 313 of the first switcher to the first output port 351, and the third switcher 330 may selectively connect the fourth input port 344 or the second sub output port 314 of the first switcher to the second output port 352.

Referring to FIG. 6C, the second switcher 320 may include a third sub input port 321 connected to the first input port 341 and a fourth sub input port 322 connected to the first sub input port 313; a third sub output port 323 connected to the first output port 351; and a second switch 324 for connecting one of the third and fourth sub input ports 321 and 322 to the third sub output port 323.

As a result, if the second switch 324 connects the third sub input port 321 and the third sub output port 323, an RF signal received through the first input port 341 may be output through the first output port 351 to the image processor 160. Alternatively, if the second switch 324 connects the fourth sub input port 322 and the third sub output port 323, an RF signal received through the second input port 342 or the third input port 343 may be output through the first output port 351 to the image processor 160.

As such, as the second switcher 320 selectively connects the third sub output port 323 to the third sub input port 321 or the fourth sub input port 322, the first output port 351 may output the RF signal received through the first input port 341, the second input port 342, or the third input port 343.

Similar to the second switcher 320, the third switcher 330 may include a fifth sub input port 331 connected to the second output port 314 and a sixth sub input port 332 connected to the fourth input port 344; a fourth sub output port 333 connected to the second output port 352; and a third switch 334 for connecting one of the fifth and sixth sub input ports 331 and 332 to the fourth sub output port 333.

As a result, if the third switch 334 connects the fifth sub input port 331 and the fourth sub output port 333, an RF signal received through the second input port 342 or the third input port 343 may be output through the second output port 352 to the image processor 160. Alternatively, if the third switch 334 connects the sixth sub input port 332 and the fourth sub output port 333, an RF signal received through the fourth input port 344 may be output through the second output port 352 to the image processor 160.

As such, as the third switcher 330 selectively connects the fourth sub output port 333 to the fifth sub input port 321 or the sixth sub input port 332, the second output port 352 may output the RF signal received through the second input port 342, the third input port 343, or the fourth input port 344.

In an embodiment, the second and third switchers 320 and 330 may be implemented in the form of Single Pole Double Throw (SPDT) or Single Pole Two Throw (SP2T), but are not limited thereto.

The switching cell 300 as described above may output any combination of two of four RF signals input through the input port 340 as output signals. This may mean that the switching cell 300 in accordance with an embodiment of the present disclosure has some degrees of freedom to output desired output signals for input signals.

A method for controlling the first to third switchers 310, 320, and 330 to output desired output signals, which may be performed in one switching cell 300, will now be described.

FIGS. 7A to 7F are diagrams for explaining methods for connecting input ports and output ports in a switching cell, according to embodiments of the present disclosure. In FIGS. 7A to 7F, RF signals input through the first to fourth input ports 341, 342, 343, and 344 of the switching cell 300 are denoted by IN1, IN2, IN3, and IN4, respectively.

Figure 7A:
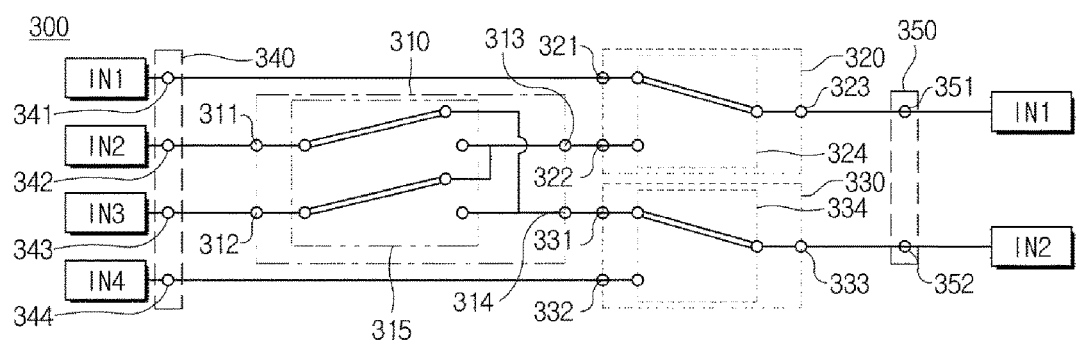
FIGS. 7A, 7B, 7C, 7D, 7E, and 7F are diagrams for explaining methods for connecting input ports and output ports in a switching cell, according to embodiments of the present disclosure.

First, a case where RF signals IN1 and IN2 input through the first and second input ports 341 and 342, respectively, are output as output signals will be described. Referring to FIG. 7A, the switching cell 300 may use the first switcher 310 to form a path from the first sub input port 311 to the second sub output port 314 and a path from the second sub input port 312 to the first sub output port 313. Furthermore, the switching cell 300 may use the second switcher 320 to form a path from the third sub input port 321 to the third sub output port 323 and use the third switcher 330 to form a path from the fifth sub input port 331 to the fourth sub output port 333.

As a result, the RF signal IN1 input through the first input port 341 may be output to the first output port 351 through the path from the third sub input port 321 to the third sub output port 323. Also, the RF signal IN2 input through the second input port 342 may be output to the second output port 352 through the path from the first sub input port 311 to the second sub output port 314 and the path from the fifth sub input port 331 to the fourth sub output port 333.

Figure 7B:
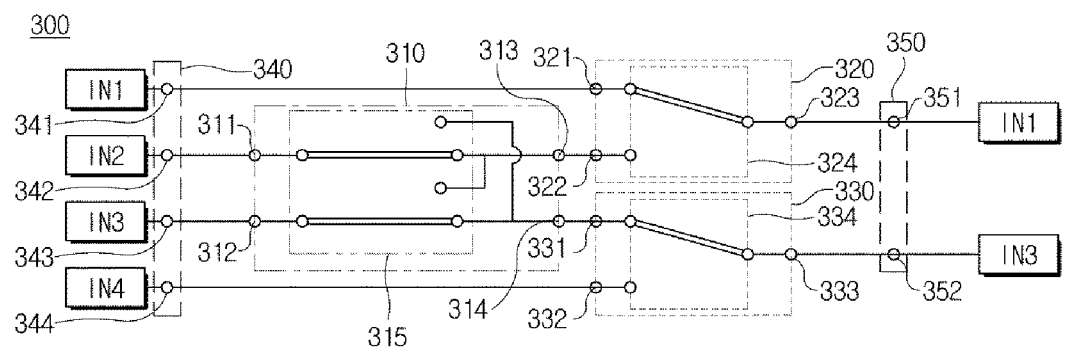

Next, a case where RF signals IN1 and IN3 input through the first and third input ports 341 and 343, respectively, are output as output signals will be described. Referring to FIG. 7B, the switching cell 300 may use the first switcher 310 to form a path from the first sub input port 311 to the first sub output port 313 and a path from the second sub input port 312 to the second sub output port 314. Furthermore, the switching cell 300 may use the second switcher 320 to form a path from the third sub input port 321 to the third sub output port 323 and use the third switcher 330 to form a path from the fifth sub input port 331 to the fourth sub output port 333.

As a result, the RF signal IN1 input through the first input port 341 may be output to the first output port 351 through the path from the third sub input port 321 to the third sub output port 323. Also, the RF signal IN3 input through the third input port 343 may be output to the second output port 352 through the path from the second sub input port 312 to the second sub output port 314 and the path from the fifth sub input port 331 to the fourth sub output port 333.

Figure 7C:
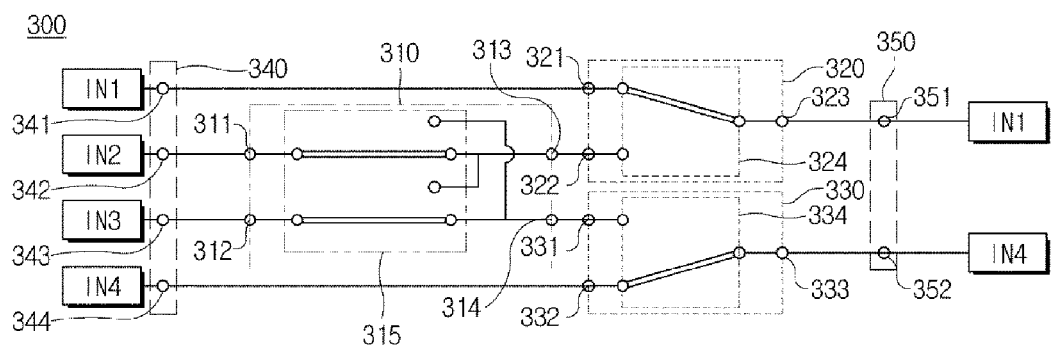

Next, a case where RF signals IN1 and IN4 input through the first and fourth input ports 341 and 344, respectively, are output as output signals will be described. Referring to FIG. 7C, the switching cell 300 may use the first switcher 310 to form a path from the first sub input port 311 to the first sub output port 313 and a path from the second sub input port 312 to the second sub output port 314. Furthermore, the switching cell 300 may use the second switcher 320 to form a path from the third sub input port 321 to the third sub output port 323 and use the third switcher 330 to form a path from the sixth sub input port 332 to the fourth sub output port 333.

As a result, the RF signal IN1 input through the first input port 341 may be output to the first output port 351 through the path from the third sub input port 321 to the third sub output port 323. Also, the RF signal IN4 input through the fourth input port 344 may be output to the second output port 352 through the path from the sixth sub input port 332 to the fourth sub output port 333.

Figure 7D:
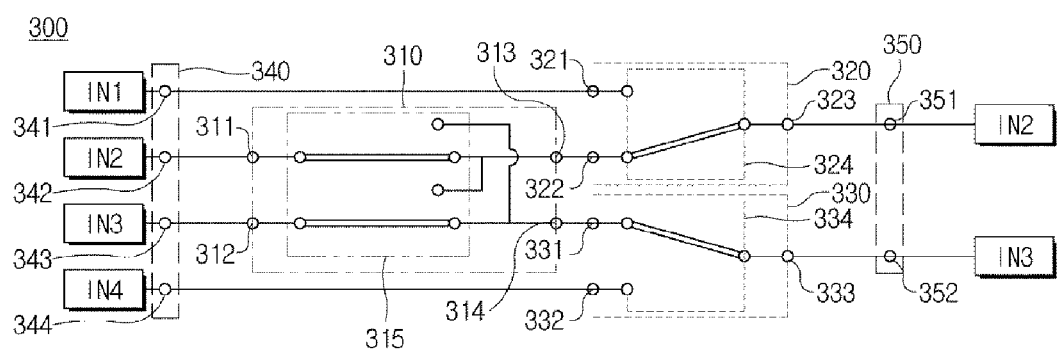

Next, a case where RF signals IN2 and IN3 input through the second and third input ports 342 and 343, respectively, are output as output signals will be described. Referring to FIG. 7D, the switching cell 300 may use the first switcher 310 to form a path from the first sub input port 311 to the first sub output port 313 and a path from the second sub input port 312 to the second sub output port 314. Furthermore, the switching cell 300 may use the second switcher 320 to form a path from the fourth sub input port 322 to the third sub output port 323 and use the third switcher 330 to form a path from the fifth sub input port 331 to the fourth sub output port 333.

As a result, the RF signal IN2 input through the second input port 342 may be output to the first output port 351 through the path from the first sub input port 311 to the first sub output port 313 and the path from the fourth sub input port 322 to the third sub output port 323. Also, the RF signal IN3 input through the third input port 343 may be output to the second output port 352 through the path from the second sub input port 312 to the second sub output port 314 and the path from the fifth sub input port 331 to the fourth sub output port 333.

Figure 7E:
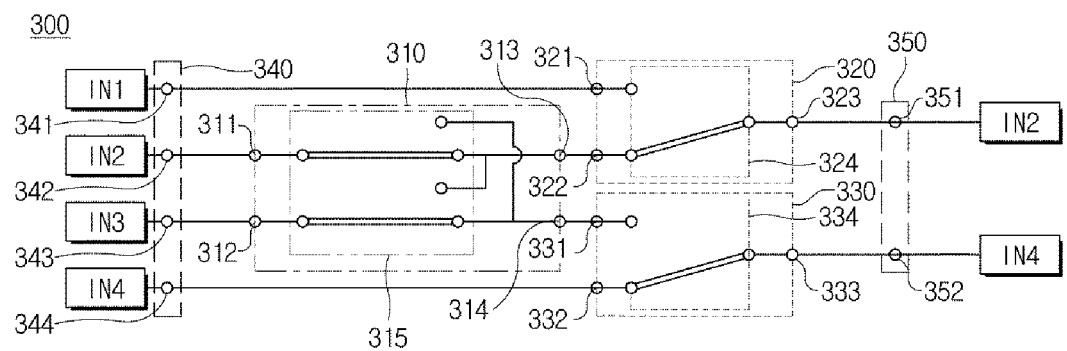

Next, a case where RF signals IN2 and IN4 input through the second and fourth input ports 342 and 344, respectively, are output as output signals will be described. Referring to FIG. 7E, the switching cell 300 may use the first switcher 310 to form a path from the first sub input port 311 to the first sub output port 313 and a path from the second sub input port 312 to the second sub output port 314. Furthermore, the switching cell 300 may use the second switcher 320 to form a path from the fourth sub input port 322 to the third sub output port 323 and use the third switcher 330 to form a path from the sixth sub input port 332 to the fourth sub output port 333.

As a result, the RF signal IN2 input through the second input port 342 may be output to the first output port 351 through the path from the first sub input port 311 to the first sub output port 313 and the path from the fourth sub input port 322 to the third sub output port 323. Also, the RF signal IN4 input through the fourth input port 344 may be output to the second output port 352 through the path from the sixth sub input port 332 to the fourth sub output port 333.

Figure 7F:
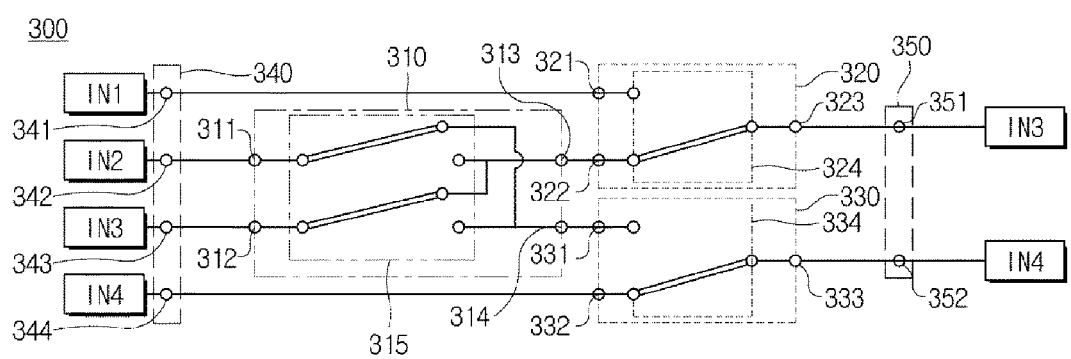

Next, a case where RF signals IN3 and IN4 input through the third and fourth input ports 343 and 344, respectively, are output as output signals will be described. Referring to FIG. 7F, the switching cell 300 may use the first switcher 310 to form a path from the first sub input port 311 to the second sub output port 314 and a path from the second sub input port 312 to the first sub output port 313. Furthermore, the switching cell 300 may use the second switcher 320 to form a path from the fourth sub input port 322 to the third sub output port 323 and use the third switcher 330 to form a path from the sixth sub input port 332 to the fourth sub output port 333.

As a result, the RF signal IN3 input through the third input port 343 may be output to the first output port 351 through the path from the second sub input port 312 to the first sub output port 313 and the path from the fourth sub input port 322 to the third sub output port 323. Also, the RF signal IN4 input through the fourth input port 344 may be output to the second output port 352 through the path from the sixth sub input port 332 to the fourth sub output port 333.

As such, the switching cell 300 as described above may output any combination of two of four input signals IN1 to IN4 as output signals.

In embodiments of FIGS. 6C and 7A to 7F, the second and third switchers 320 and 330 may be implemented in the form of SPDT or SP2T. However, the second and third switchers 320 and 330 may also be implemented in the form of DPDT in some other embodiments.

Figure 8:
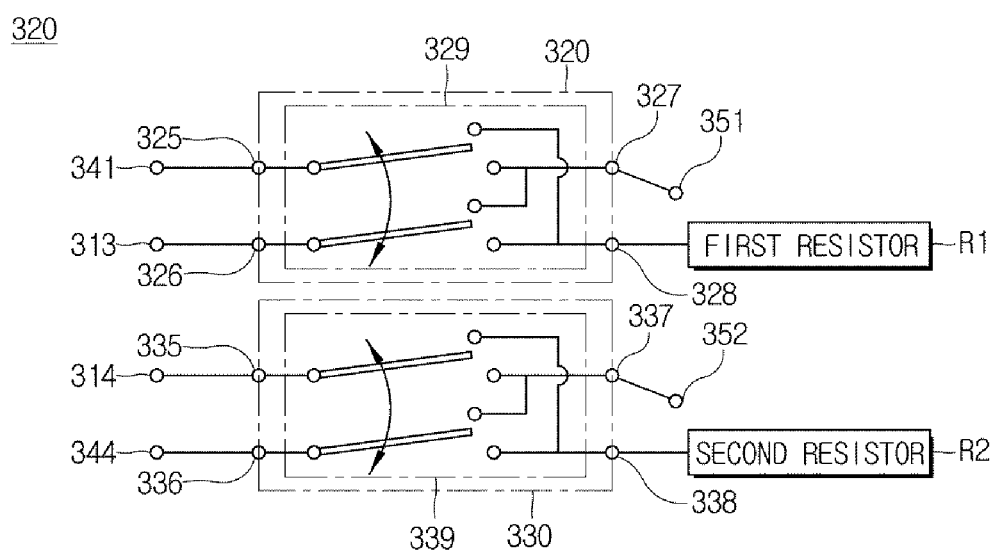
FIG. 8 is a circuit diagram of second and third switchers in a switching cell, according to an embodiment of the present disclosure.

FIG. 8 is a circuit diagram of second and third switchers in a switching cell, according to an embodiment of the present disclosure.

The second switcher 320 of FIG. 8 may include a third sub input port 325 connected to the first input port 341 and a fourth sub input port 326 connected to the first sub output port 313; the fifth sub output port 327 connected to the first output port 351, and the sixth sub output port 328 connected to a first resistor R1; and a fourth switch 329 for connecting the third sub input port 325 to one of the fifth and sixth sub output ports 327 and 328 and connecting the fourth sub input port 326 to the other one of the fifth and sixth sub output ports 327 and 328.

The fourth switch 329 may connect the fourth sub input port 326 to the sixth sub output port 328 while connecting the third sub input port 325 to the fifth sub output port 327. Alternatively, the fourth switch 329 may connect the fourth sub input port 326 to the fifth sub output port 327 while connecting the third sub input port 325 to the sixth sub output port 328.

As a result, if the fourth switch 329 forms a path from the third sub input port 325 to the fifth sub output port 327 and a path from the fourth sub input port 326 to the sixth sub output port 328, an RF signal received through the first input port 341 may be output through the first output port 351 to the image processor 160. Alternatively, if the fourth switch 329 forms a path from the third sub input port 325 to the sixth sub output port 328 and a path from the fourth sub input port 326 to the fifth sub output port 327, an RF signal received through the second input port 342 or the third input port 343 may be output through the first output port 351 to the image processor 160.

As such, as the second switcher 320 connects the third sub input port 325 or fourth sub input port 326 to the fifth sub output port 327, the first output port 351 may output the RF signal received through the first input port 341, the second input port 342, or the third input port 343.

Similarly, the third switcher 330 of FIG. 8 may include a fifth sub input port 335 connected to the second sub input port 314 and a sixth sub input port 336 connected to the fourth output port 344; the seventh sub output port 337 connected to the second output port 352, and the eighth sub output port 338 connected to a second resistor R2; and a fifth switch 339 for connecting the fifth sub input port 335 to one of the seventh and eighth sub output ports 337 and 338 and connecting the sixth sub input port 336 to the other one of the seventh and eight sub output ports 337 and 338.

The fifth switch 339 may connect the sixth sub input port 336 to the eighth sub output port 338 while connecting the fifth sub input port 335 to the seventh sub output port 337. Alternatively, the fifth switch 339 may connect the sixth sub input port 336 to the seventh sub output port 337 while connecting the fifth sub input port 335 to the eighth sub output port 338.

As a result, if the fifth switch 339 forms a path from the fifth sub input port 335 to the seventh sub output port 337 and a path from the sixth sub input port 336 to the eighth sub output port 338, an RF signal received through the second input port 342 or the third input port 343 may be output through the second output port 352 to the image processor 160. Alternatively, if the fifth switch 339 forms a path from the fifth sub input port 335 to the eighth sub output port 338 and a path from the sixth sub input port 336 to the seventh sub output port 337, an RF signal received through the fourth input port 344 may be output through the second output port 352 to the image processor 160.

As such, as the third switcher 330 connects the fifth sub input port 335 or sixth sub input port 336 to the seventh sub output port 337, the second output port 352 may output the RF signal received through the second input port 342, the third input port 343, or the fourth input port 344.

Like the embodiments of FIGS. 7A to 7F, the switching cell 300 including the second and third switches 324 and 334 in accordance with an embodiment of FIG. 8 may output any combination of two of four RF signals input through the input port 340 as output signals.

A method for controlling the first to third switchers 310, 320, and 330 to output desired output signals in accordance with other embodiments of the present disclosure, which may be performed in one switching cell 300, will now be described.

FIGS. 9A to 9F are diagrams for explaining methods for connecting input ports and output ports in a switching cell, according to embodiments of the present disclosure. In FIGS. 9A to 9F, RF signals input through the first to fourth input ports 341, 342, 343, and 344 of the switching cell 300 are denoted by IN1, IN2, IN3, and IN4, respectively.

Figure 9A:
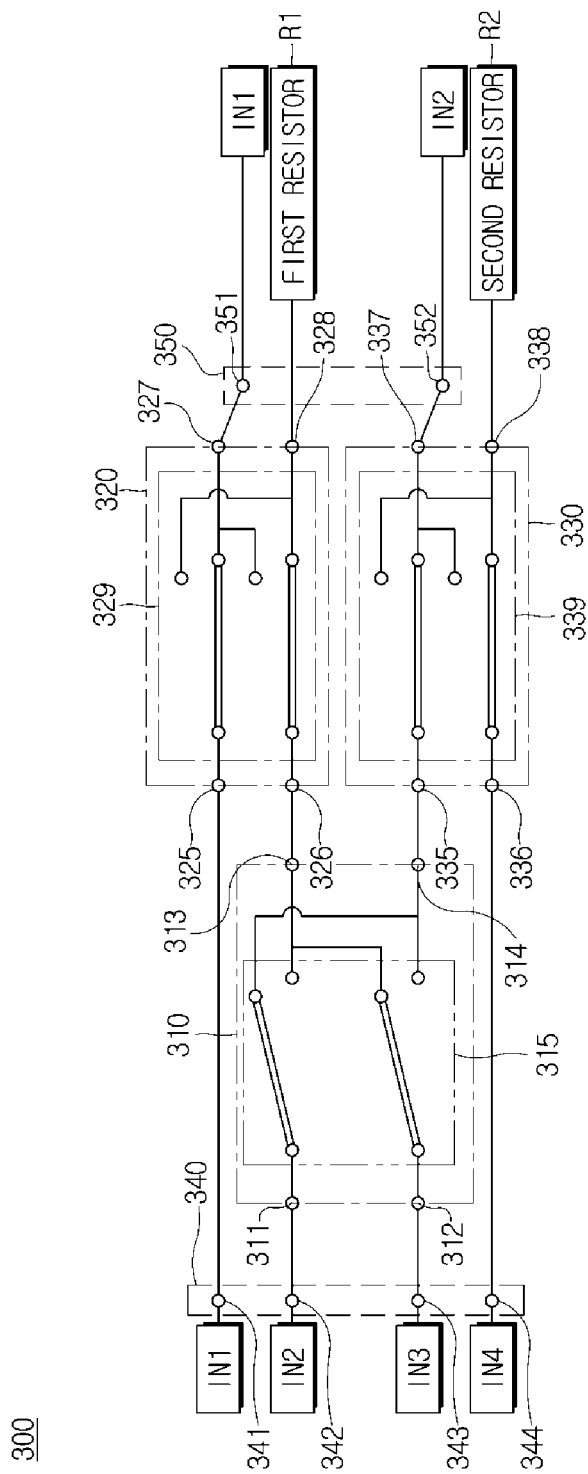
FIGS. 9A, 9B, 9C, 9D, 9E, and 9F are diagrams for explaining methods for connecting input ports and output ports in a switching cell, according to other embodiments of the present disclosure.

First, a case where RF signals IN1 and IN2 input through the first and second input ports 341 and 342, respectively, are output as output signals will be described. Referring to FIG. 9A, the switching cell 300 may use the first switcher 310 to form a path from the first sub input port 311 to the second sub output port 314 and a path from the second sub input port 312 to the first sub output port 313. Also, the switching cell 300 may use the second switcher 320 to form a path from the third sub input port 325 to the fifth sub output port 327 and a path from the fourth sub input port 326 to the sixth sub output port 328, and may use the third switcher 330 to form a path from the fifth sub input port 335 to the seventh sub output port 337 and a path from the sixth sub input port 336 to the eighth sub output port 338.

As a result, the RF signal IN1 input through the first input port 341 may be output to the first output port 351 through the path from the third sub input port 325 to the fifth sub output port 327. The RF signal IN2 input through the second input port 342 may be output to the second output port 352 through the path from the first sub input port 311 to the second sub output port 314 and the path from the fifth sub input port 335 to the seventh sub output port 337.

Figure 9B:
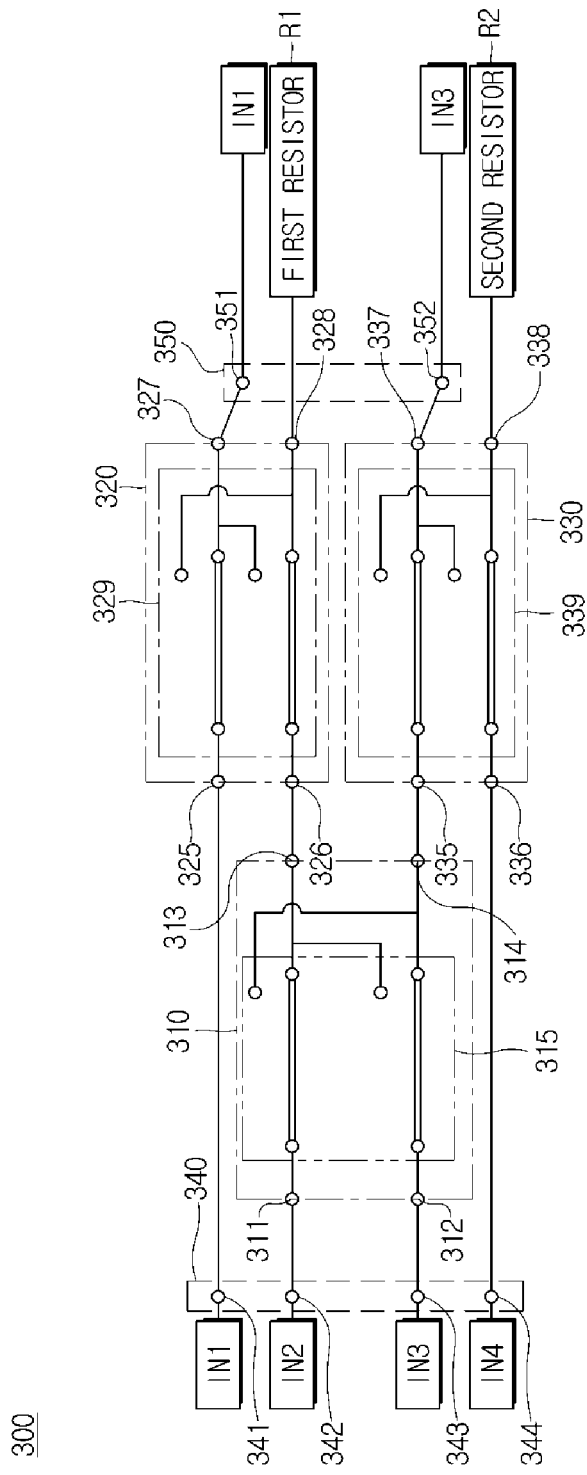

Next, a case where RF signals IN1 and IN3 input through the first and third input ports 341 and 343, respectively, are output as output signals will be described. Referring to FIG. 9B, the switching cell 300 may use the first switcher 310 to form a path from the first sub input port 311 to the first sub output port 313 and a path from the second sub input port 312 to the second sub output port 314. Also, the switching cell 300 may use the second switcher 320 to form a path from the third sub input port 325 to the fifth sub output port 327 and a path from the fourth sub input port 326 to the sixth sub output port 328, and may use the third switcher 330 to form a path from the fifth sub input port 335 to the seventh sub output port 337 and a path from the sixth sub input port 336 to the eighth sub output port 338.

As a result, the RF signal IN1 input through the first input port 341 may be output to the first output port 351 through the path from the third sub input port 325 to the fifth sub output port 327. Also, the RF signal IN3 input through the third input port 343 may be output to the second output port 352 through the path from the second sub input port 312 to the second sub output port 314 and the path from the fifth sub input port 335 to the seventh sub output port 337.

Figure 9C:
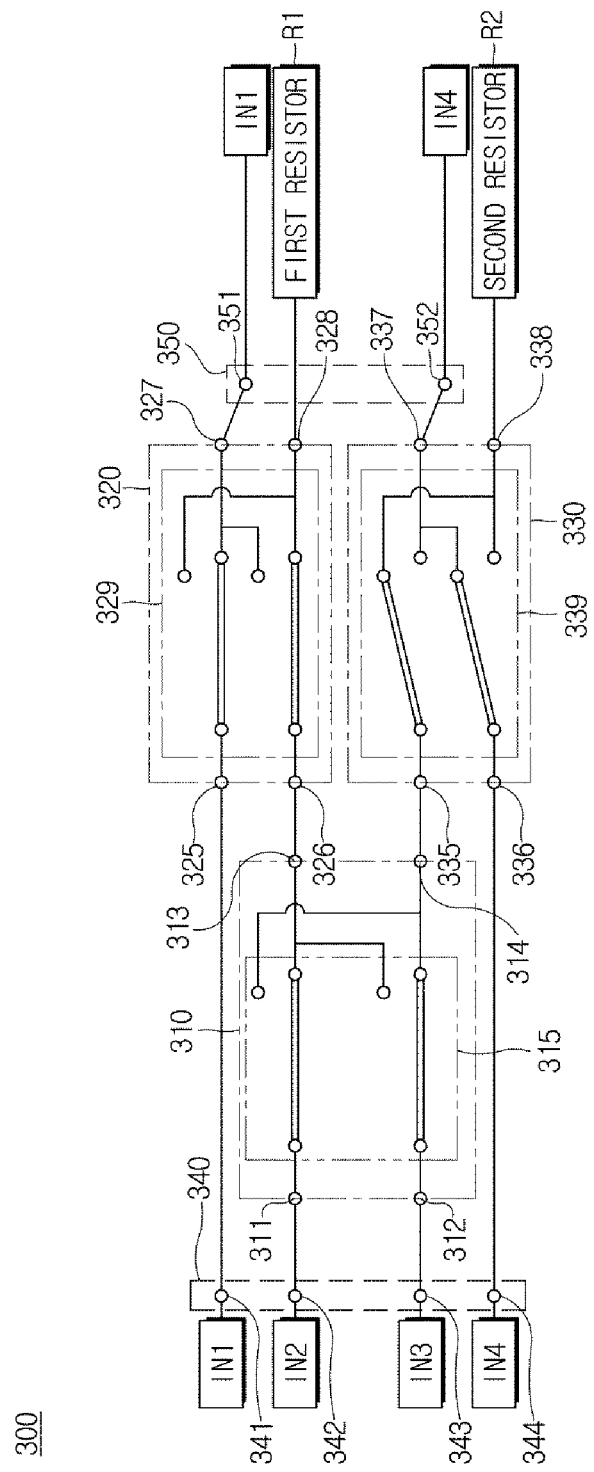

Next, a case where RF signals IN1 and IN4 input through the first and fourth input ports 341 and 344, respectively, are output as output signals will be described. Referring to FIG. 9C, the switching cell 300 may use the first switcher 310 to form a path from the first sub input port 311 to the first sub output port 313 and a path from the second sub input port 312 to the second sub output port 314. Also, the switching cell 300 may use the second switcher 320 to form a path from the third sub input port 325 to the fifth sub output port 327 and a path from the fourth sub input port 326 to the sixth sub output port 328, and may use the third switcher 330 to form a path from the fifth sub input port 335 to the eighth sub output port 338 and a path from the sixth sub input port 336 to the seventh sub output port 337.

As a result, the RF signal IN1 input through the first input port 341 may be output to the first output port 351 through the path from the third sub input port 325 to the fifth sub output port 327. Also, the RF signal IN4 input through the fourth input port 344 may be output to the second output port 352 through the path from the sixth sub input port 336 to the seventh sub output port 337.

Figure 9D:
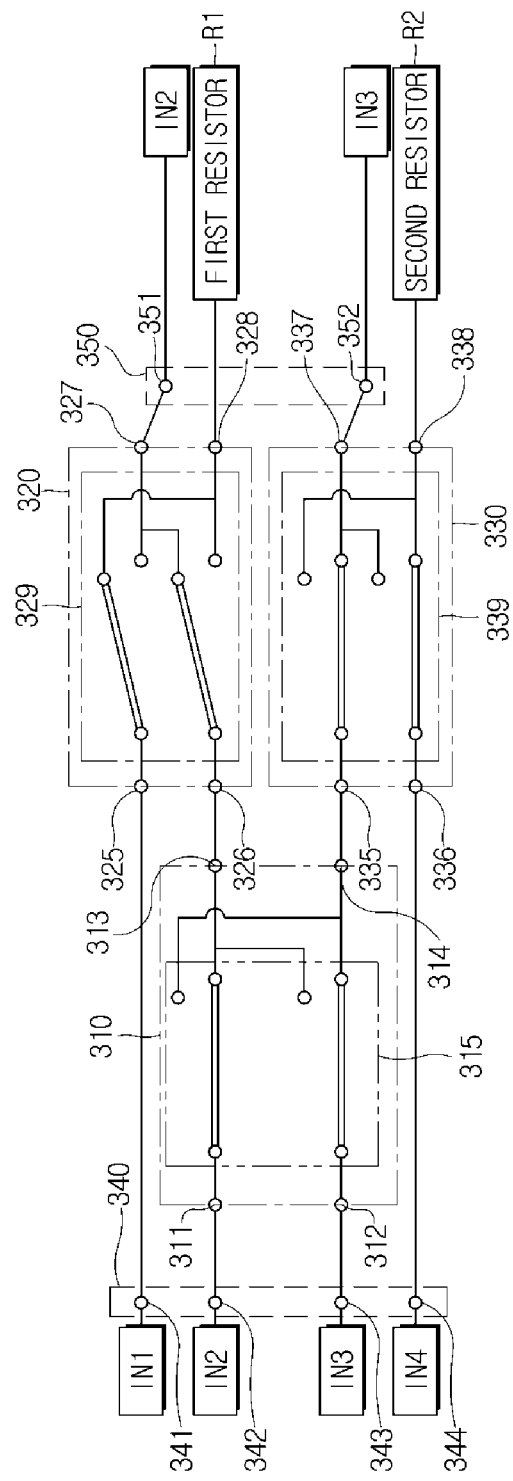

Next, a case where RF signals IN2 and IN3 input through the second and third input ports 342 and 343, respectively, are output as output signals will be described. Referring to FIG. 9D, the switching cell 300 may use the first switcher 310 to form a path from the first sub input port 311 to the first sub output port 313 and a path from the second sub input port 312 to the second sub output port 314. Also, the switching cell 300 may use the second switcher 320 to form a path from the third sub input port 325 to the sixth sub output port 328 and a path from the fourth sub input port 326 to the fifth sub output port 327, and may use the third switcher 330 to form a path from the fifth sub input port 335 to the seventh sub output port 337 and a path from the sixth sub input port 336 to the eighth sub output port 338.

As a result, the RF signal IN2 input through the second input port 342 may be output to the first output port 351 through the path from the first sub input port 311 to the first sub output port 313 and the path from the fourth sub input port 326 to the fifth sub output port 327. Also, the RF signal IN3 input through the third input port 343 may be output to the second output port 352 through the path from the second sub input port 312 to the second sub output port 314 and the path from the fifth sub input port 335 to the seventh sub output port 337.

Figure 9E:
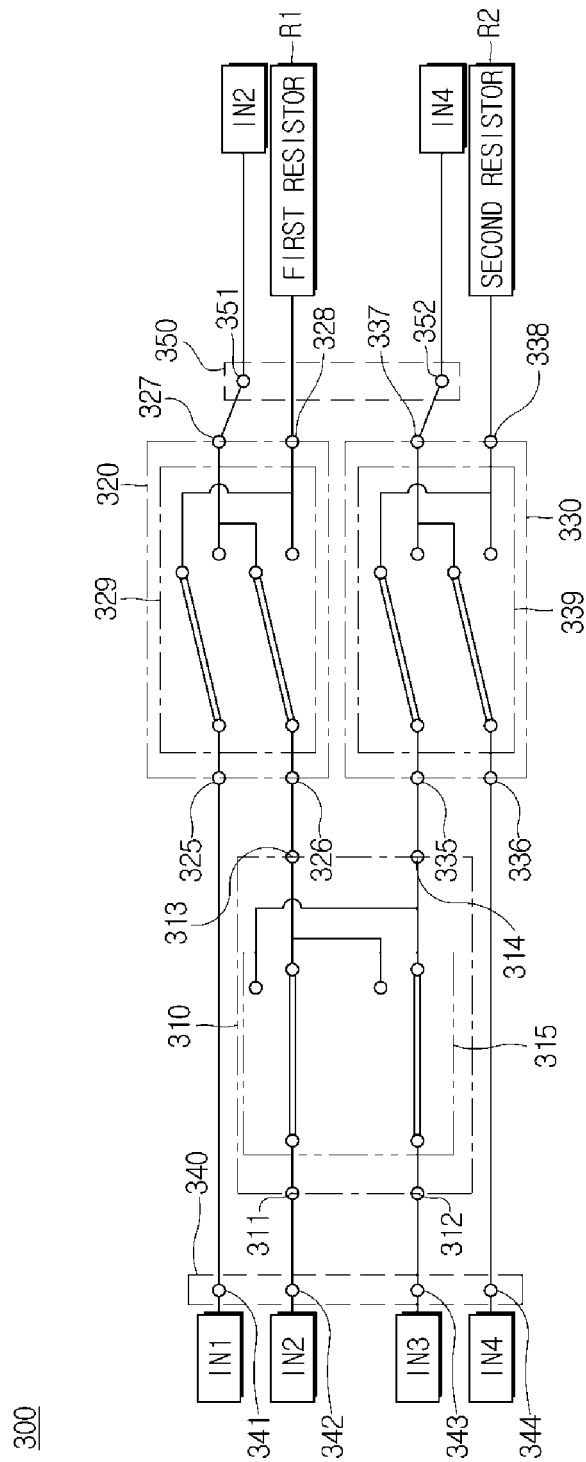

Next, a case where RF signals IN2 and IN4 input through the second and fourth input ports 342 and 344, respectively, are output as output signals will be described. Referring to FIG. 9E, the switching cell 300 may use the first switcher 310 to form a path from the first sub input port 311 to the first sub output port 313 and a path from the second sub input port 312 to the second sub output port 314. Also, the switching cell 300 may use the second switcher 320 to form a path from the third sub input port 325 to the sixth sub output port 328 and a path from the fourth sub input port 326 to the fifth sub output port 327, and may use the third switcher 330 to form a path from the fifth sub input port 335 to the eighth sub output port 338 and a path from the sixth sub input port 336 to the seventh sub output port 337.

As a result, the RF signal IN2 input through the second input port 342 may be output to the first output port 351 through the path from the first sub input port 311 to the first sub output port 313 and the path from the fourth sub input port 326 to the fifth sub output port 327. Also, the RF signal IN4 input through the fourth input port 344 may be output to the second output port 352 through the path from the sixth sub input port 336 to the seventh sub output port 337.

Figure 9F:
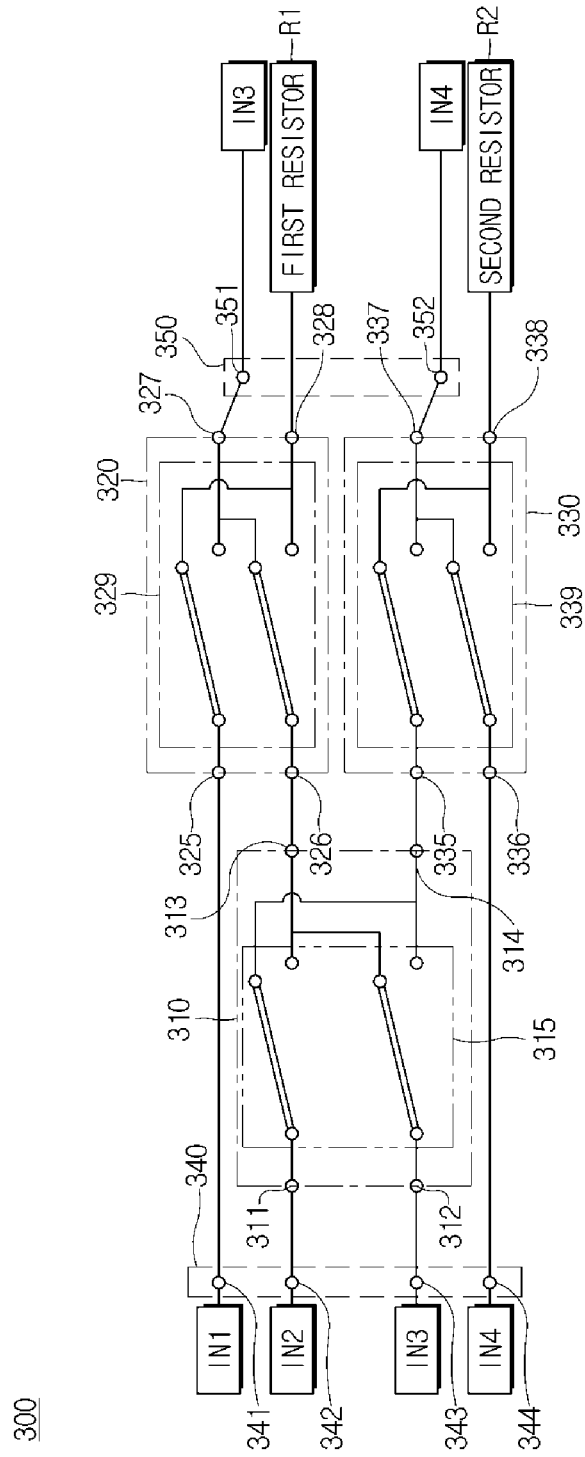

Next, a case where RF signals IN3 and IN4 input through the third and fourth input ports 343 and 344, respectively, are output as output signals will be described. Referring to FIG. 9F, the switching cell 300 may use the first switcher 310 to form a path from the first sub input port 311 to the second sub output port 314 and a path from the second sub input port 312 to the first sub output port 313. Also, the switching cell 300 may use the second switcher 320 to form a path from the third sub input port 325 to the sixth sub output port 328 and a path from the fourth sub input port 326 to the fifth sub output port 327, and may use the third switcher 330 to form a path from the fifth sub input port 335 to the eighth sub output port 338 and a path from the sixth sub input port 336 to the seventh sub output port 337.

As a result, the RF signal IN3 input through the third input port 343 may be output to the first output port 351 through the path from the second sub input port 312 to the first sub output port 313 and the path from the fourth sub input port 326 to the fifth sub output port 327. Also, the RF signal IN4 input through the fourth input port 344 may be output to the second output port 352 through the path from the sixth sub input port 336 to the seventh sub output port 337.

As such, the switching cell 300 as described above may output any combination of two of four input signals IN1 to IN4 as output signals.

The switching unit 200 having switching cells 300 that operate independently has thus far been described. In the following description, it is assumed that the switching unit 200 includes upper switching cells 400 each having two switching cells 300.

Figure 10A:
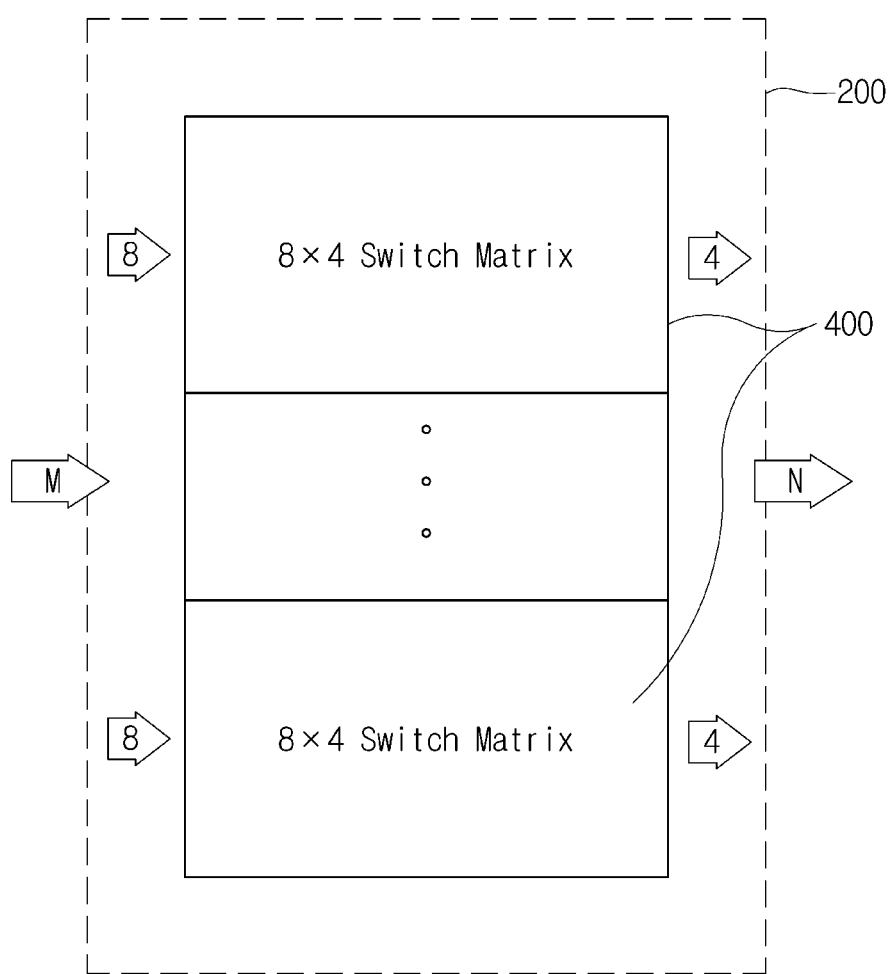
FIGS. 10A, 10B, and 10C are diagrams for explaining operation of a switching unit and the constituent upper switching cells, according to an embodiment of the present disclosure.
Figure 10B:
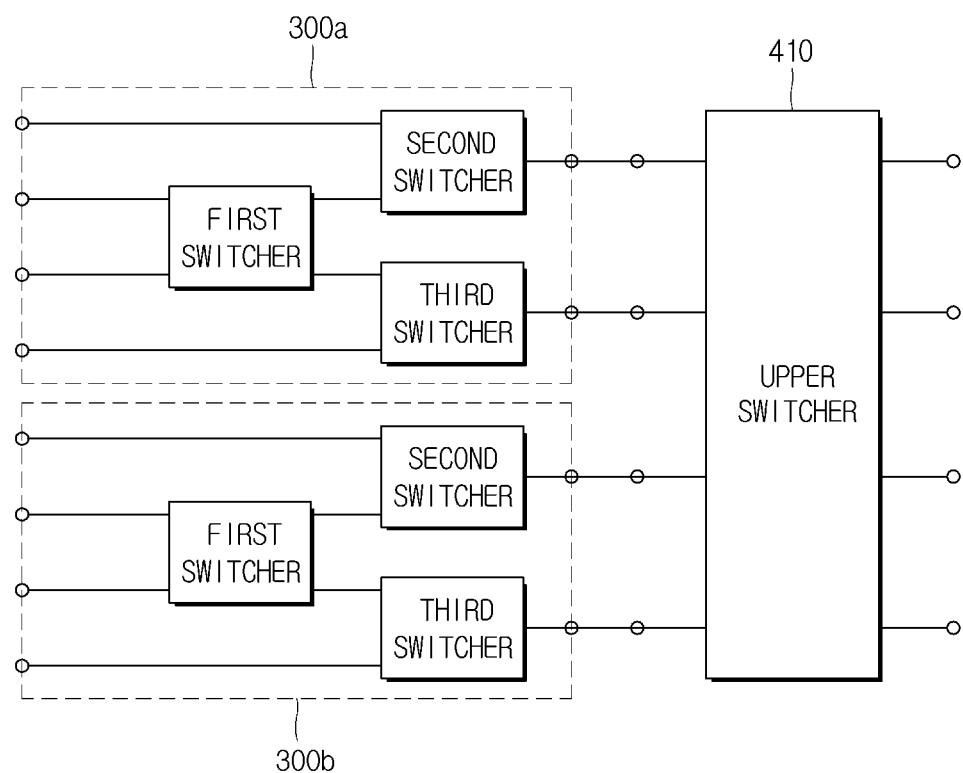
Figure 10C:
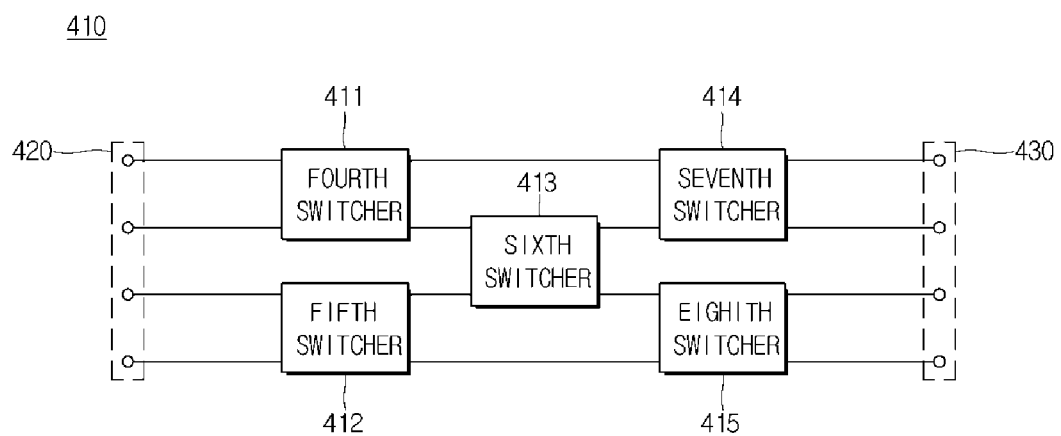

FIGS. 10A, 10B, and 10C are diagrams for explaining operation of a switching unit and the constituent upper switching cells, according to an embodiment of the present disclosure.

FIG. 10A is a diagram for explaining a way for the switching unit 200 to output signals, according to an embodiment of the present disclosure. The switching unit 200 of FIG. 10A includes M input ports 340 that may be coupled to a plurality of coils that make up the RF receiver coil 170 and N output ports 350 coupled to the image processor 160.

Referring to FIG. 10A, the M×N switching unit 200 may be divided into 8×4 upper switching cells 400. Specifically, the switching unit 200 having the M input ports 340 and N output ports 350 may include a plurality of upper switching cells 400 each with eight input ports and four output ports. The plurality of upper switching cells 400 are separately configured, and connections between the eighth input ports and four output ports of each upper switching cell 400 may be controlled.

FIG. 10B is a block diagram of an upper switching cell 400 according to an embodiment of the present disclosure, and FIG. 10C is a circuit diagram of the upper switching cell 400 according to an embodiment of the present disclosure.

The upper switching cell 400 in accordance with an embodiment of the present disclosure may include two switching cells 300a, 300b, and an upper switcher 410.

The switching cell 300 as described above may be applied to the two switching cells 300a, 300b included in the upper switching cell 400. In other words, the switching cell 300 in accordance with the various embodiments of the present disclosure in connection with FIGS. 6 to 9 may be applied to each of the two switching cells 300a, 300b. Accordingly, the two switching cells 300a, 300b may be configured to have an identical circuit or different circuits from each other.

The upper switcher 410 is connected to the output ports 350 of the two switching cells 300a, 300b for outputting signals output from the two switching cells 300a, 300b.

Referring to FIG. 10C, the upper switcher 410 in accordance with an embodiment of the present disclosure may include four upper input ports 420 connected to the four output ports 350 of the two switching cells 300a, 300b; four upper output ports 430 connected to the four upper input ports 420; a fourth switcher 411 for switching between paths extended from the two output ports 350 of the first switching cell 300a of the two switching cells 300a, 300b; a fifth switcher 412 for switching paths extended from the two output ports 350 of the second switching cell 300b of the two switching cells 300a, 300b; a sixth switcher 413 for switching between one of paths produced by the fourth switcher 411 and one of paths produced by the fifth switcher 412; a seventh switcher 414 for switching between the other one of paths produced by the fourth switcher 411 and one of paths produced by the sixth switcher 413; and an eighth switcher 415 for switching between the other one of paths produced by the fifth switcher 412 and the other one of paths produced by the sixth switcher 413.

The fourth to eighth switchers 411 to 415 may be implemented in various forms within a technical idea that switches between the input ports 340 and the output ports 350. For example, the fourth to eighth switchers 411 to 415 may be implemented in the same circuit as the first switcher 310 in accordance with various embodiments as described above in connection with FIGS. 6 to 9.

In the embodiment of FIGS. 10A to 10C, the upper switcher 410 may form a path for an RF signal input through one of the four upper input ports 420 to be output through one of the four upper output ports 430. As a result, the upper switching cell 400 including the upper switcher 410 increases degrees of output freedom for the inputs.

Figure 11:
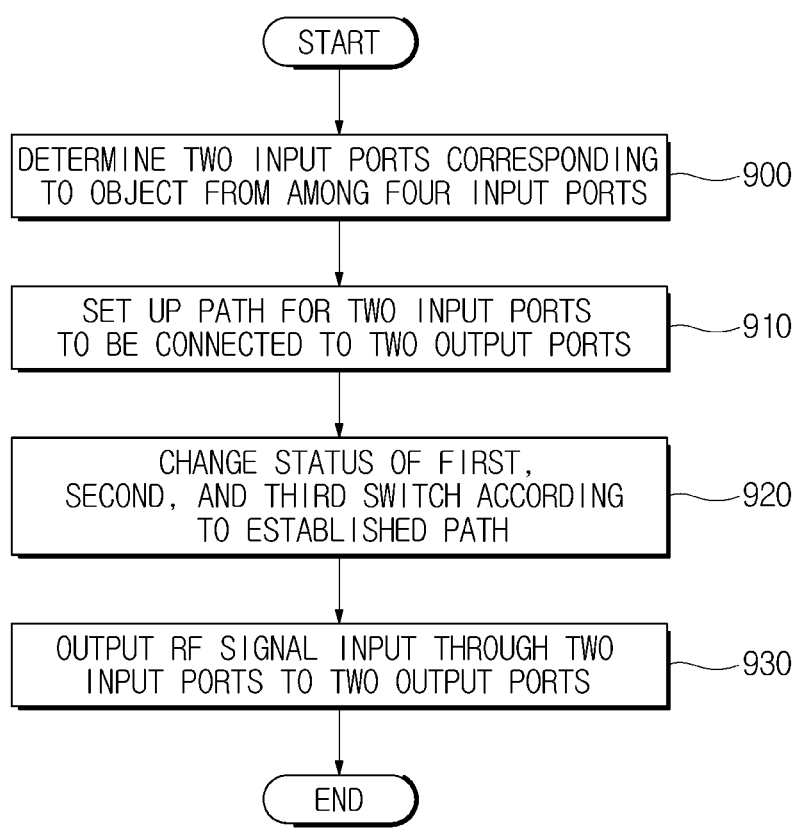
FIG. 11 is a flowchart illustrating a method for controlling an MRI device, according to an embodiment of the present disclosure.

FIG. 11 is a flowchart illustrating a method for controlling an MRI device, according to an embodiment of the present disclosure. In FIG. 11, a method for outputting output signals for input signals in each switching cell 300 is described.

The MRI device may determine two input ports corresponding to the object (ob) from among four input ports 340, in operation 900. The two input ports corresponding to the object (ob) may refer to two input ports coupled with coils that receive RF signals from the object (ob) to be imaged. The four input ports 340 may be coupled with coils that receive RF signals from different objects (ob).

The MRI device may set up paths for the two determined input ports to be connected to two output ports 350, in operation 910. The switching cell 300 includes the first switcher 310 for switching between paths extending from second and third input ports 342 and 343 among the four input ports 340; the second switcher 320 for selectively connecting one of the paths produced by the first switcher 310 or the first input port 341 of the four input ports 340 to the first output port 351 of the two output ports 350; and the third switcher 330 for selectively connecting the other one of the paths produced by the first switcher 310 or the fourth input port 344 of the four input ports 340 to the second output port 352 of the two output ports 350, so the MRI device may determine the status of each of the first to third switchers 310, 320, and 330 to set up paths to connect the two input ports 340 and the two output ports 350.

Once the paths are set up, the MRI device may change the status of each of the first to third switchers 310, 320, and 330 based on the paths, in operation 920. How to change the status of each of the first to third switchers 310, 320, and 330 based on the paths are described above in connection with FIGS. 7A to 7F and 9A to 9F, so the detailed description will be omitted herein.

The MRI device may output the RF signals received through the determined two input ports 340 to the two output ports 350, in operation 930. As the two input ports 340 determined already are connected to the two output ports 350, the RF signals input to the two input ports 340 may be output through the two output ports 350.

According to embodiments of an MRI device and method for controlling the same, circuit size may be reduced and manufacturing cost may be saved by reducing the number of switches while guaranteeing degrees of output freedom.

DESCRIPTION OF THE SYMBOLS

170: RF RECEIVER COIL
200: SWITCHING UNIT
300: SWITCHING CELL
310: FIRST SWITCHER
320: SECOND SWITCHER
330: THIRD SWITCHER
340: INPUT PORT
350: OUTPUT PORT
400: UPPER SWITCHING CELL
410: UPPER SWITCHER

Although a few embodiments have been shown and described, it would be appreciated by those skilled in the art that changes may be made in these embodiments without departing from the principles and spirit of the disclosure, the scope of which is defined in the claims and their equivalents.

What is claimed is:

1. A magnetic resonance imaging (MRI) apparatus comprising:
    a plurality of radio frequency (RF) coils configured to receive RF signals from an object to which magnetic fields are applied;
    an image processor configured to create a magnetic resonance image based on the received RF signals; and
    a switching unit configured to switch connections between a plurality of input ports connectable to the plurality of RF coils and a plurality of output ports connectable to the image processor,
    wherein the switching unit comprises:
        at least one switching cell including
            four input ports, including a first input port, a second input port, a third input port, and a fourth input port, among the plurality of input ports,
            two output ports among the plurality of output ports and connectable to two of the four input ports, and
            a first switcher configured to switch between the second input port and the third input port among the four input ports in a linked manner.

2. The MRI apparatus of claim 1,
wherein the switching cell further comprises:
    a second switcher configured to selectively connect the first switcher or the first input port of the four input ports to a first output port of the two output ports; and
    a third switcher configured to selectively connect the first switcher or the fourth input port of the four input ports to a second output port of the two output ports.

3. The MRI apparatus of claim 1,
wherein the first switcher comprises:
    a first sub input port connected to the second input port, and a second sub input port connected to the third input port;
    a first sub output port, and a second sub output port; and
    a first switch configured to connect the first sub input port to one of the first and second sub output ports and connect the second sub input port to the other one of the first and second sub output ports.

4. The MRI apparatus of claim 3,
wherein the switching cell further comprises:
    a second switcher configured to selectively connect a first input port of the four input ports or the first sub output port of the first switcher to the first output port of the two output ports; and
    a third switcher configured to selectively connect a fourth input port of the four input ports or the second sub output port of the first switcher to the second output port of the two output ports.

5. The MRI apparatus of claim 3,
wherein the second switcher comprises:
    a third sub input port connected to the first input port, and a fourth sub input port connected to the first sub output port; and
wherein the third switcher comprises:
    a fifth sub input port connected to the second sub input port, and a sixth sub input port connected to the fourth input port.

6. The MRI apparatus of claim 5,
wherein the second switcher comprises:
    a third sub output port connected to the first output port of the two output ports; and
    a second switch configured to connect one of the third and fourth sub input ports to the third sub output port, and
wherein the third switcher comprises:
    a fourth sub output port connected to the second output port of the two output ports; and
    a third switch configured to connect one of the fifth and sixth sub input ports to the fourth sub output port.

7. The MRI apparatus of claim 5,
wherein the second switcher comprises:
    a fifth sub output port connected to the first output port of the two output ports, and a sixth sub output port connected to a first resistor; and
    a fourth switch configured to connect the third sub input port to one of the fifth and sixth sub output ports and connect the fourth sub input port to the other one of the fifth and sixth sub output ports, and
wherein the third switcher comprises:
    a seventh sub output port connected to the first output port of the two output ports, and an eighth sub output port connected to a second resistor; and
    a fifth switch configured to connect the fifth sub input port to one of the seventh and eighth sub output ports and connect the sixth sub input port to the other one of the seventh and eighth sub output ports.

8. The MRI apparatus of claim 1,
wherein the switching unit further comprises:
    at least one upper switching cell including two switching cells and an upper switcher configured to switch between four output ports of the two switching cells.

9. The MRI apparatus of claim 8,
wherein the upper switcher includes four upper input ports connected to four output ports of the two switching cells and four upper output ports connected to the four upper input ports, and switches connections between the four upper input ports and the four output ports.

10. The MRI apparatus of claim 8,
wherein the upper switcher comprises
    a fourth switcher configured to switch between the two output ports of a first switching cell of the two switching cells;

a fifth switcher configured to switch between the two output ports of a second switching cell of the two switching cells;
a sixth switcher configured to switch between the fourth switcher and the fifth switcher;
a seventh switcher configured to switch between the fourth switcher and the sixth switcher; and
an eighth switcher configured to switch between the fifth switcher and the sixth switcher.

11. A method for controlling a magnetic resonance imaging (MRI) apparatus including at least one switching cell configured to switch between four input ports, including a first input port, a second input port, a third input port, and a fourth input port, connectable to radio frequency (RF) coils receiving RF signals of an object and two output ports connectable to two of the four input ports, the method comprising:
determining two input ports corresponding to the object from among the four input ports;
changing a status of a first switcher configured to switch between the second and third input ports of the four input ports in a linked manner, such that the determined input ports are connected to the output ports;
changing a status of a second switcher to connect the first switcher or the first input port of the four input ports to a first output port of the two output ports, according to the status of the first switcher; and
changing a status of a third switcher to connect the first switcher or the fourth input port of the four input ports to a second output port of the two output ports, according to the status of the first switcher.

12. The method of claim 11,
wherein the determining the two input ports comprises:
determining two input ports that are coupled with some of the RF coils, which receive RF signals originated from the object.

13. The method of claim 11,
wherein the changing the status of the first switcher comprises:
changing the first switcher into one of a first state of connecting a first sub input port of the first switcher connected to the second input port to a first sub output port of the first switcher and connecting a second sub input port of the first switcher connected to the third input port to a second sub output port of the first switcher, and a second state of connecting the first sub input port to the second sub output port and connecting the second sub input port to the first sub output port.

14. The method of claim 13,
wherein the changing the status of the second switcher comprises:
changing the second switcher into one of a third state of connecting a third sub input port of the second switcher connected to the first input port of the four input ports to the first output port, and a fourth state of connecting a fourth sub input port of the second switcher connected to the first sub output port of the first switcher to the first output port.

15. The method of claim 13,
wherein the changing the status of the third switcher comprises:
changing the third switcher into one of a fifth state of connecting a fifth sub input port of the third switcher connected to the fourth input port of the four input ports to the second output port, and a sixth state of connecting a sixth sub input port of the third switcher connected to the second sub output port of the first switcher to the second output port.

16. An apparatus comprising:
N radio frequency coils, N being an integer greater than two, configured to receive radio frequency signals from an object to which a magnetic field is applied;
an image processor; and
a switch connected to the N radio frequency coils and configured to provide radio frequency signals received by M radio frequency coils to the image processor by switching between the N radio frequency coils in a linked manner, M being an integer less than N,
wherein the image processor is configured to create a magnetic resonance image based on the radio frequency signals provided to the image processor.

* * * * *